(12) United States Patent
Yamagishi et al.

(10) Patent No.: US 8,421,347 B2
(45) Date of Patent: Apr. 16, 2013

(54) INTEGRATED ORGANIC LIGHT-EMITTING DEVICE, METHOD FOR PRODUCING ORGANIC LIGHT-EMITTING DEVICE AND ORGANIC LIGHT-EMITTING DEVICE PRODUCED BY THE METHOD

(75) Inventors: Hideo Yamagishi, Kamikita-gun (JP); Akira Nishikawa, Kamikita-gun (JP); Shigeru Ayukawa, Tokyo (JP)

(73) Assignee: Kaneka Corporation, Osaka-shi (JP)

( * ) Notice: Subject to any disclaimer, the term of this patent is extended or adjusted under 35 U.S.C. 154(b) by 0 days.

(21) Appl. No.: 13/392,485

(22) PCT Filed: Aug. 27, 2010

(86) PCT No.: PCT/JP2010/064596
§ 371 (c)(1),
(2), (4) Date: Feb. 24, 2012

(87) PCT Pub. No.: WO2011/024951
PCT Pub. Date: Mar. 3, 2011

(65) Prior Publication Data
US 2012/0161616 A1 Jun. 28, 2012

(30) Foreign Application Priority Data
Aug. 27, 2009 (JP) ................. 2009-196669

(51) Int. Cl.
*H05B 33/10* (2006.01)
*H05B 33/12* (2006.01)
*H05B 33/28* (2006.01)
*H01L 51/50* (2006.01)

(52) U.S. Cl.
USPC ............... 313/504; 313/506; 445/24; 445/43

(58) Field of Classification Search ......................... None
See application file for complete search history.

(56) References Cited

U.S. PATENT DOCUMENTS
7,635,883 B2 * 12/2009 Azami et al. .................. 257/291
7,799,585 B2 * 9/2010 Erchak et al. .................. 438/26
(Continued)

FOREIGN PATENT DOCUMENTS
JP 6314592 A 11/1994
JP 2003272860 A 9/2003
(Continued)

OTHER PUBLICATIONS
International Bureau of WIPO, International Preliminary Report of Patentability of PCT/JP2010/064596, Mar. 22, 2012, WIPO, 7 pages.
(Continued)

*Primary Examiner* — Ashok Patel
(74) *Attorney, Agent, or Firm* — Alleman Hall McCoy Russell & Tuttle LLP

(57) ABSTRACT

In a device according to the present invention, a first conductive electrode layer being patterned and light transmissive is formed on a light-transmissive substrate and a laminated layer containing a plurality of organic-compound layers is formed so as to cover at least a part of the first electrode layer. The laminated layer is partly removed so that the first electrode layer is partly exposed. At least one layer containing a second conductive electrode layer is formed on the laminated layer and the exposed part of the first electrode layer. A part of the laminated layer and a part of the second electrode layer are simultaneously removed by application of a laser beam from a side of the substrate, so that a plurality of light-emitting sections are electrically connected in series on the substrate.

21 Claims, 30 Drawing Sheets

U.S. PATENT DOCUMENTS

2003/0207645 A1* 11/2003 George et al. .................. 445/24
2009/0170230 A1* 7/2009 Kidu et al. ..................... 438/35

FOREIGN PATENT DOCUMENTS

| JP | 2003297568 A | 10/2003 |
| JP | 2004031102 A | 1/2004 |
| JP | 2008311096 A | 12/2008 |
| JP | 2009181752 A | 8/2009 |
| WO | 2004057674 A2 | 7/2004 |
| WO | 2006010911 A2 | 2/2006 |

OTHER PUBLICATIONS

ISA Japan, International Search Report of PCT/JP2010/064596, Oct. 26, 2010, WIPO, 2 pages.

* cited by examiner

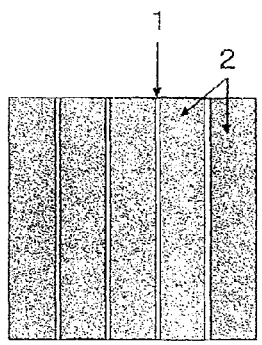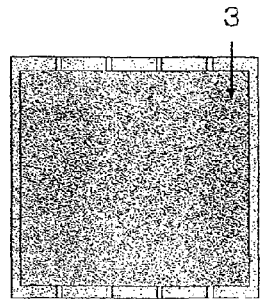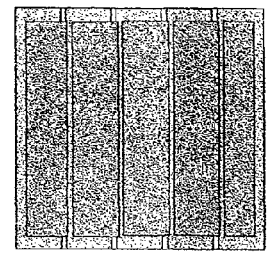
FIG.1A  FIG.1B  FIG. 1C
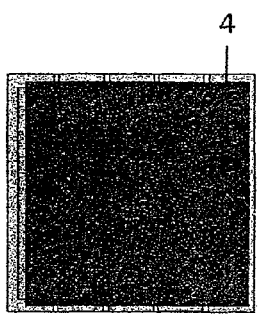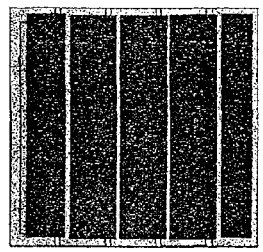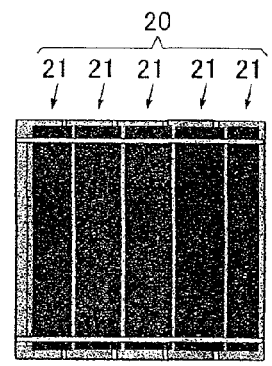
FIG. 1D  FIG. 1E  FIG. 1F
FIG. 2
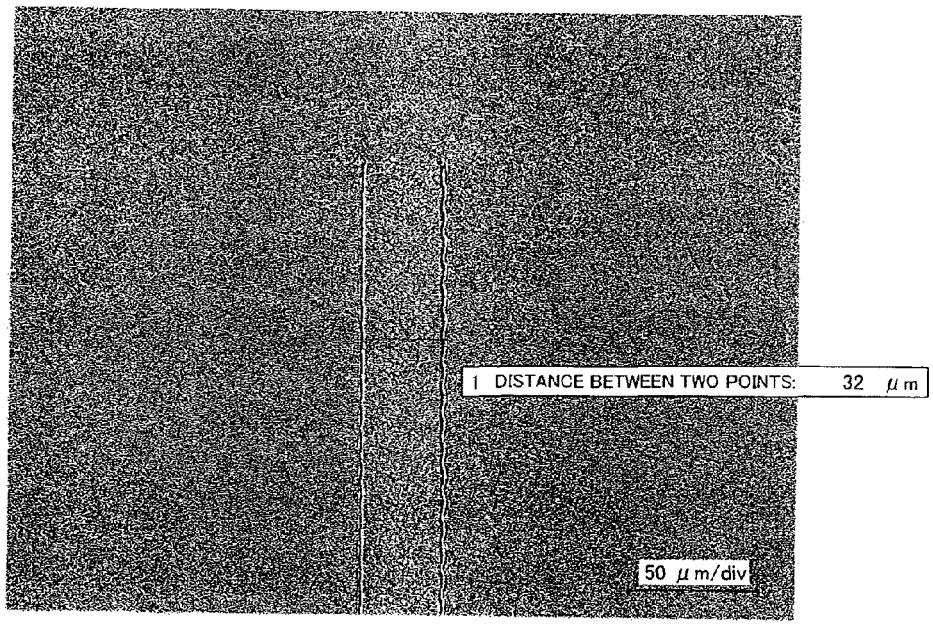

FIG. 9
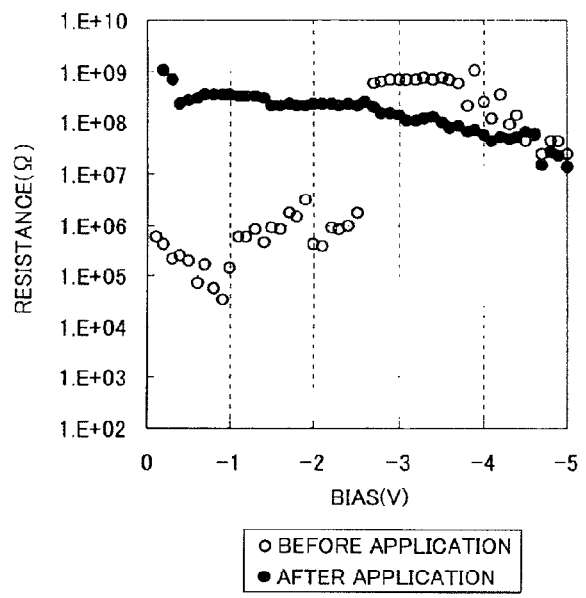
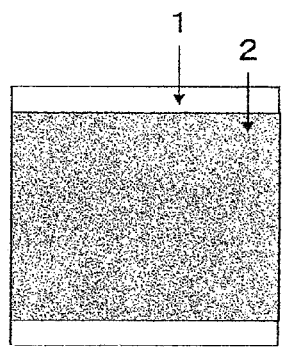
FIG. 10A
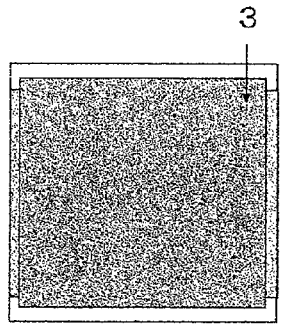
FIG. 10B
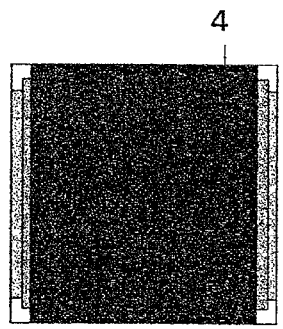
FIG. 10C

FIG. 37
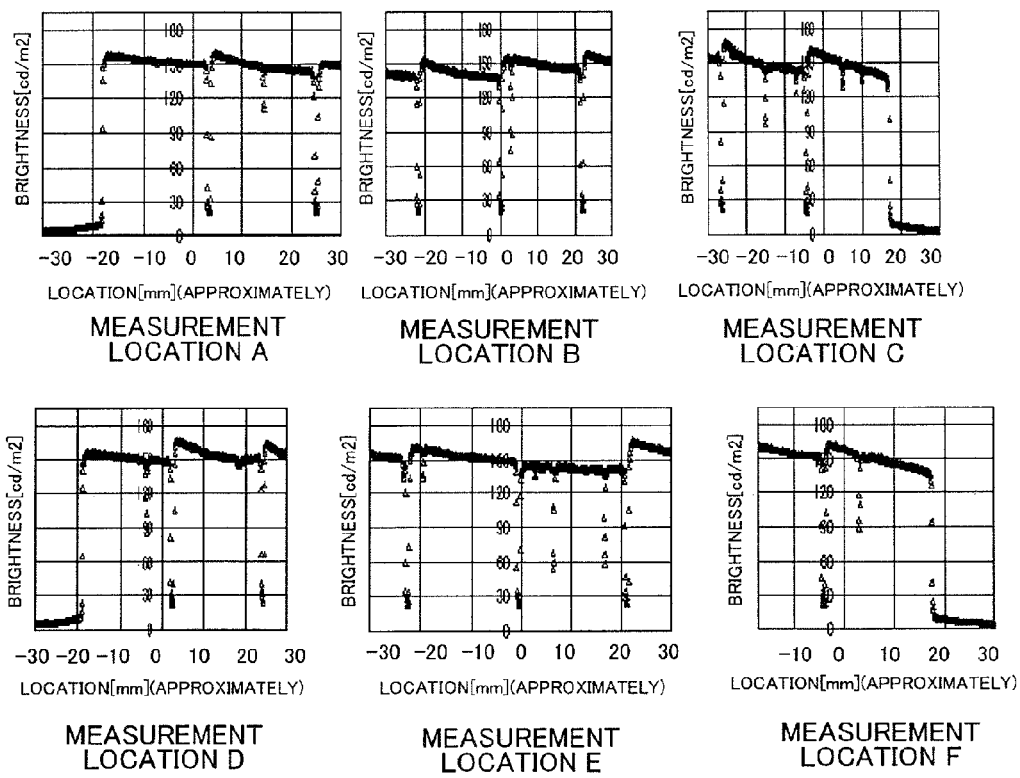
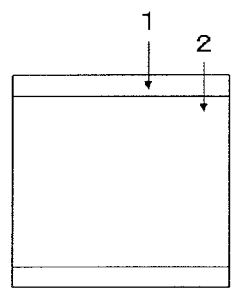
FIG. 38A
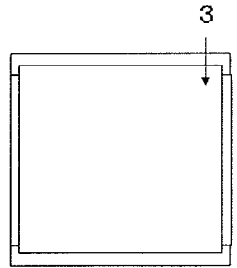
FIG. 38B
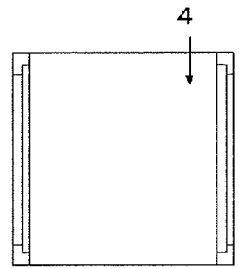
FIG. 38C

INTEGRATED ORGANIC LIGHT-EMITTING DEVICE, METHOD FOR PRODUCING ORGANIC LIGHT-EMITTING DEVICE AND ORGANIC LIGHT-EMITTING DEVICE PRODUCED BY THE METHOD

TECHNICAL FIELD

The present invention relates to a method for producing an organic light-emitting device containing an organic layer as a surface light source or an organic electroluminescent (EL) device used mainly for illumination.

The present invention also relates to a configuration of an organic light-emitting device.

BACKGROUND ART

Organic EL elements used in organic EL devices are semiconductor elements that convert electrical energy into optical energy. Recently, research using organic EL elements has been conducted at an accelerated pace. In the field of illumination, this research has already started to clarify issues with putting organic EL devices into practical use. Improved materials, such as an organic material that may form an organic EL element, achieve dramatically lowered driving voltages and increased luminance efficiency. Also, in the display market, televisions using organic EL elements for display screens have come to market.

An increase in current density is attained by impressing a strong electric field so as to obtain a high brightness. It is known that this increase in current density normally generates heat, resulting in acceleration of deterioration of an organic thin film.

An organic EL element has two or more electrodes (a first electrode layer and a second electrode layer) to apply a voltage to the element, at least one of which uses a light-transmissive conductive material, so that when a voltage is applied to the element light generated within the element is emitted outside. Such light-transmissive conductive materials include an extremely thin film made of metal such as Ag or Au, and metal oxide such as indium-doped tin oxide or aluminum-doped zinc oxide. These materials have higher resistance than a metal electrode layer, which normally requires no light transmittance. The higher resistance causes heat generation during power distribution, further resulting in many problems such as reduced luminance efficiency and expanded brightness distribution, in addition to the deterioration described above.

These problems are especially severe in application of surface-emitting organic EL devices to large-area illumination. Some ingenuity is required so as to obtain satisfactory performance. An effective means for solving these problems would be to increase the driving voltage without changing the driving current per unit area.

An EL element forms a p-n junction and emits light by injection of electrons and holes and recombination of those electrons and holes within the element by application of a forward voltage. Formation of a multi-junction connected in series by lamination of a plurality of such junctions in a film-thickness direction increases the driving voltage and further improves the light-emitting brightness without changing the driving current. The patent document 1 specified below discloses a laminated organic light-emitting element, which contains an electrically-insulated charge generation layer between laminated light-emitting units, the charge generation layer being contactless with two-layered internal electrodes and having a specific resistance of $1.0 \times 10^5$ Ω·cm or more. The electrically-insulated thin film simultaneously generates holes and electrons, which are respectively injectable in a hole transport layer and an electron transport layer by application of an electric field to the laminated organic light-emitting element, thereby being applicable to a technique for serially connecting a plurality of light-emitting units (Multi-Photon Emission).

This technique is quite effective for a certain level of area enlargement, but has a problem in that the lamination involves an increased number of man-hours and materials, and further, too much lamination leads to a reduced brightness or luminance efficiency due to absorption of light by the resulting laminated body. Basically, this technique is characterized in that it obtains a high brightness by an equivalent driving current, but because it does not reduce an absolute value of driving current density, it is limited as a means to enlarge the area.

Another means for increasing the driving voltage without changing the driving current per unit area is to divide an element in a film-surface direction and electrically connect the divided elements in series. Several techniques are studied using this means. The patent document 2 specified below discloses a method for producing an organic EL device, in which a patterned lower electrode and a patterned upper electrode are electrically connected in series. This method may achieve the desired purpose to some extent, but is mostly premised on a mask process, resulting in a limitation in area enlargement and problems of complicated procedures and greater loss in the effective area. Still another and similar technique for utilizing a rear cover is disclosed in the patent document 3 specified below, but this technique has essentially the same problems as those in patent document 2.

Patent Documents
    Patent Document 1: JP 3933591 B
    Patent Document 2: JP 2006-511073 A
    Patent Document 3: JP 2008-508673 A

DISCLOSURE OF INVENTION

Technical Problem

Area enlargement of an organic EL device presents a problem in the resistance value of a light-transmissive conductive electrode layer, revealing problems such as reduced luminance efficiency, element deterioration, and expanded brightness distribution due to heat generation. An object to be solved by the present invention is to reduce the problems described above caused by heat generated mainly by the resistance value of a light-transmissive conductive electrode layer. The present invention basically aims to provide a method for producing a large-area organic EL device for high-performance illumination and an organic EL device produced by the same method.

Solution to Problem

After diligent studies in view of the above-mentioned problems and drawbacks, the present inventors found that the configuration specified below solves these problems, thereby arriving at the present invention.

An aspect of the present invention is a method for producing an organic light-emitting device having a plurality of light-emitting sections electrically connected in series on a light-transmissive substrate, the method including the steps of:
(a) forming a first conductive electrode layer that is patterned and light transmissive, on the substrate;
(b) forming a laminated layer containing a plurality of organic-compound layers so that the layer covers at least a part of the first electrode layer;

(c) exposing a part of the first electrode layer by removal of a part of the laminated layer;

(d) forming at least one layer containing a second conductive electrode layer on the laminated layer and the exposed part of the first electrode layer; and (e) simultaneously removing a part of the laminated layer and a part of the second electrode layer by application of the laser beam from a side of the substrate.

A preferred embodiment relates to the above method for producing an organic light-emitting device, wherein the above step (a) includes a step of removing a part of the first electrode layer by application of the laser beam after forming the first electrode layer on the substrate.

A preferred embodiment relates to the above method for producing an organic light-emitting device, wherein the laminated layer has an outermost layer farthest from the substrate, the outermost layer being a conductive thin-film layer.

A preferred embodiment relates to the above method for producing an organic light-emitting device, wherein step (c) includes a step of applying a laser beam onto the laminated layer.

A preferred embodiment relates to the above method for producing an organic light-emitting device, wherein the step of applying the laser beam is done from a side of the substrate.

A preferred embodiment relates to the above method for producing an organic light-emitting device, wherein the laser beam used in step (e) has a light source of a high harmonic of a neodymium YAG laser.

A preferred embodiment relates to the above method for producing an organic light-emitting device, wherein the laser beam used in step (c) has a light source of a high harmonic of a neodymium YAG laser.

A preferred embodiment relates to the above method for producing an organic light-emitting device, wherein step (a) includes a step of removing a part of the first electrode layer by applying a laser beam using a fundamental harmonic of a neodymium YAG laser as a light source after forming the first electrode layer on the substrate.

A preferred embodiment relates to the above method for producing an organic light-emitting device, further including a step of applying a voltage onto at least a part of each of the light-emitting sections on the substrate in a reverse direction after step (e) so as to reduce a leakage current from the light-emitting sections.

A preferred embodiment relates to the above method for producing an organic light-emitting device, including a step of bringing at least a part of the removed part into contact with a fluid after step (e) so as to reduce a leakage current from the light-emitting sections.

A preferred embodiment relates to the above method for producing an organic light-emitting device, wherein the laser beam used in step (e) is applied in pulses entering from the substrate and focused on a position located within the substrate or on the first electrode layer.

A preferred embodiment relates to the above method for producing an organic light-emitting device, wherein step (e) is performed by applying the pulsed laser beam from the side of the substrate, by relatively moving an application point of the laser beam to draw a linear trajectory at a constant speed, the laser beam having a pulse strength and a speed satisfying a relationship in which a number of the small holes formed by the pulses of the laser beam each have a shape increasing in diameter from the substrate toward the second electrode layer, so that the laminated layer and the second electrode layer are divided by the small holes, which overlap, and the first electrode layer has a conductive part between the holes, which do not overlap.

A preferred embodiment relates to the above method for producing an organic light-emitting device, wherein step (c) is performed by applying the laser beam onto the laminated layer, by relatively moving an application point of the laser beam to draw a linear trajectory and step (e) is also performed by forming grooves by relatively moving an application point of the laser beam to draw a linear trajectory, the linear trajectories having a distance of 130 micrometers or less between centers of the trajectories, and the method including a step of removing portions of the second electrode layer, each portion being located adjacent to each of the grooves formed after step (e).

Another aspect of the present invention relates to an organic light-emitting device produced by any of the above-mentioned methods.

An aspect of the present invention relating to an organic light-emitting device is an integrated organic light-emitting device including a laminated body consisting of a light-transmissive first electrode layer, a laminated layer containing at least one organic EL emission layer composed of an organic compound, and a second electrode layer laminated on a light-transmissive insulated substrate, the device having at least one first-electrode-layer dividing groove formed in the first electrode layer, at least one via formed in the laminated layer, and at least one unit light-emitting-element dividing groove having a depth reaching the second electrode layer from the laminated layer, wherein the first electrode layer is divided into a plurality of zones by the first-electrode-layer dividing grooves, wherein the laminated layer and the second electrode layer are divided into a plurality of zones each composed of a combination of both layers by the unit light-emitting-element dividing grooves, wherein the first-electrode-layer dividing grooves and the unit light-emitting-element dividing grooves are located at different positions so that at least the second electrode layer of one zone overhangs the first electrode layer of its adjacent zone, wherein the first electrode layer in one zone and the combination of the laminated layer and the second electrode layer laminated on the first electrode layer in the one zone constitutes a unit light-emitting element, in which a part of the second electrode layer in the one zone penetrates in the via so as to be electrically conducted to the first electrode layer in its adjacent zone, so that adjacent elements are electrically connected in series, and wherein the unit light-emitting-element dividing groove is formed by a number of continuous small holes, each hole having a shape increasing in diameter from the substrate toward the second electrode layer, so that at least the second electrode layer is divided by the holes, which overlap, and the first electrode layer has a conductive part between the holes, which do not overlap.

A preferred embodiment relates to an integrated organic light-emitting device, wherein the above mentioned small holes each start from either inside of the substrate or the first electrode layer with a shape increasing in diameter toward the second electrode layer and do not overlap in the substrate.

A preferred embodiment relates to an integrated organic light-emitting device, wherein the small holes have a distance of 10 to 80 micrometers between centers of adjacent holes.

A preferred embodiment relates to an integrated organic light-emitting device, wherein the unit light-emitting-element dividing groove is located close to the via in a planar view and increases in groove width in the vicinity of the second electrode layer toward the via.

A preferred embodiment relates to an integrated organic light-emitting device, wherein the via is a groove, the part of the second electrode layer penetrates into the via, and the unit light-emitting-element dividing groove has an edge in a width direction reaching to the part of the second electrode layer penetrating into the via.

A preferred embodiment relates to an organic light-emitting device, wherein an edge in a width direction of the unit light-emitting-element dividing groove reaches to an extent of the second electrode layer penetrating in the via.

A preferred embodiment relates to an integrated organic light-emitting device in which the laminated layer has an outermost layer in contact with the second electrode layer, and the outermost layer is made of metal.

Advantageous Effects of Invention

This invention can provide a highly reliable high-performance organic EL device of a large area, that considerably inhibits expanded brightness distribution and heat generated in power distribution to high-brightness organic EL elements using a light-transmissive conductive material, which normally has a high resistance, for an electrode.

BRIEF DESCRIPTION OF DRAWINGS

FIGS. 1A to 1F are plan views illustrating a production process of an organic EL device of Example 1;

FIG. 2 is a planar photo of a part where an ITO layer is removed by a laser application in the production process of Example 1;

FIG. 9 illustrates a resistance value between electrode layers of an integrated organic EL device embodied in Example 3;

FIGS. 10A to 10C are plan views each illustrating a patterning of an organic EL device embodied in a Comparative Example;

FIG. 37 illustrates FIG. 8 more clearly without background color;

FIGS. 38A to 38C are views of FIGS. 10A to 10C shown more clearly without background color;

DETAILED DESCRIPTION OF EMBODIMENTS

The present invention is mainly directed to an organic EL device of a bottom emission type, which mainly consists of a light-transmissive substrate such as glass or polymer film, a light-transmissive conductive layer (a light-transmissive first conductive electrode layer) as one electrode (a first electrode layer) laminated on the substrate, a plurality of various organic-compound layers (also referred to as a laminated layer or a functional layer) containing an emission layer, and a rear electrode layer (a second electrode layer) as another electrode, which are laminated on the first electrode layer.

In the organic EL device of a bottom emission type, a layer of the one electrode (first electrode layer) is a light-transmissive conductive layer (light-transmissive first conductive electrode layer), while a rear electrode layer of the other electrode (second electrode layer) is a reflecting layer such as aluminum. However, for some purposes, in order to provide for emission of light from both sides, a light-transmissive layer may be used as the rear electrode layer.

Furthermore, a primary object of the present invention is an organic EL device which may be an integrated organic EL device. Integrated organic EL device 100 is configured with strip-like organic EL elements (hereinafter referred to as "unit light-emitting elements") electrically connected in series.

Figure 13:
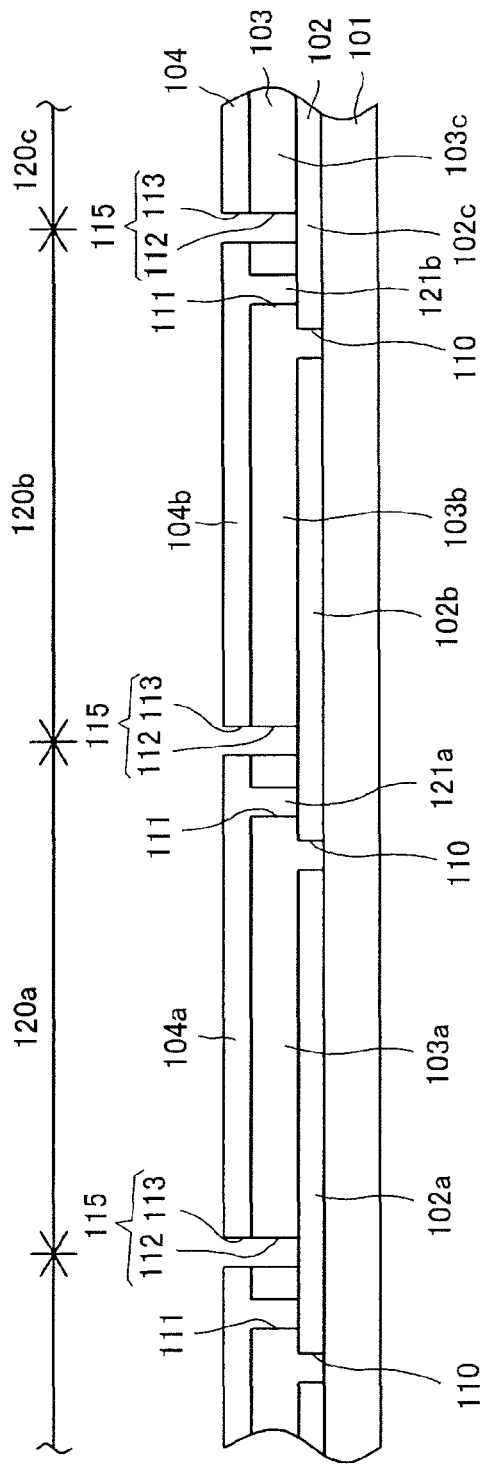
FIG. 13 is a cross section of a basic configuration of each layer and each groove of an organic EL device of the present invention.
Figure 14:
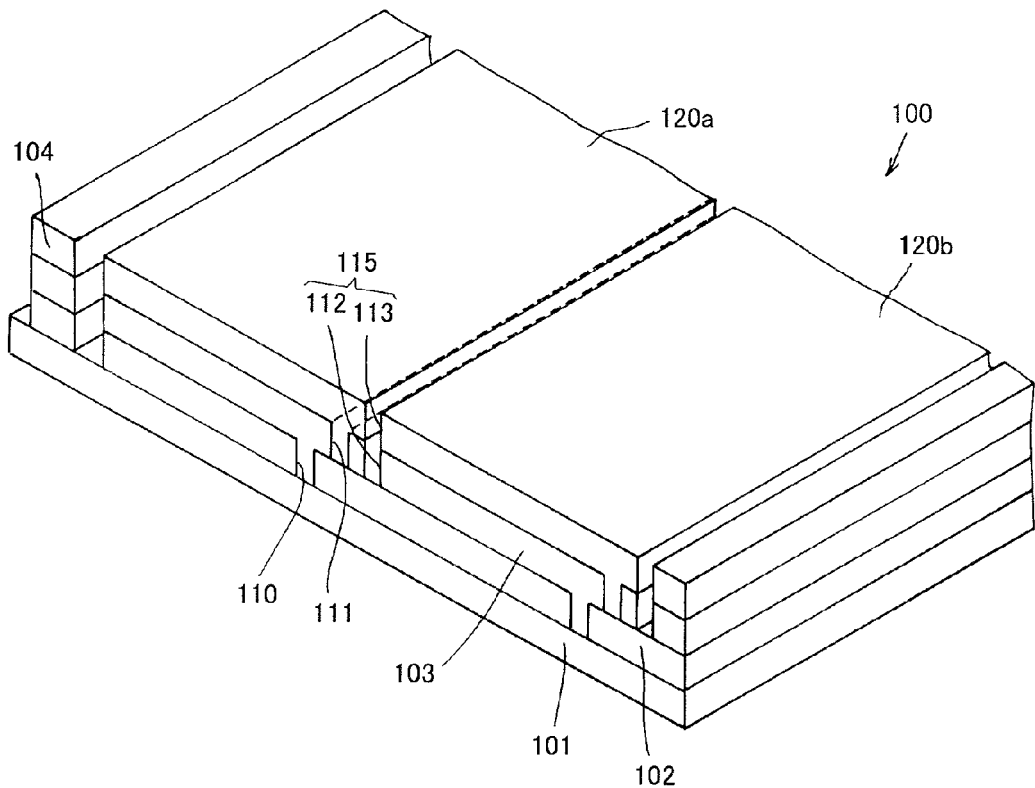
FIG. 14 is a sectional perspective view of the basic configuration of each layer and each groove of an organic EL device of the present invention.

A basic layer composition of the integrated organic EL device 100 is, as shown in FIGS. 13 and 14, constituted by a plurality of the strip-like unit light-emitting elements into which a planar organic EL element is divided by a plurality of grooves.

Specifically, the device 100 is mainly composed of a conductive electrode layer (a first electrode layer) 102, a functional layer 103, and a rear electrode layer (a second electrode layer) 104 sequentially laminated on a glass substrate 101. The functional layer 103 is a laminated layer containing a plurality of organic-compound layers such as a hole injection layer, a hole transport layer, an emission layer, an electron transport layer, and a conductive layer.

The layers constituting the device 100 have grooves 110, 111, 112, and 113 respectively.

More specifically, the first-electrode-layer dividing grooves (first grooves) 110 are formed in the conductive electrode layer 102, so as to divide the layer 102 into a plurality of zones. The emission-layer dividing grooves (second grooves) 111 are formed in the functional layer 103, so as to divide the layer 103 into a plurality of zones. The rear electrode layer 104 partly penetrates in the grooves 111, so as to make contact with the conductive electrode layer 102 at bottom faces of the grooves 111. The grooves 111 are vias (i.e., openings for electrical connection) formed in the functional layer (laminated layer) 103, so that the layer 104 partly penetrates in the vias and contacts with the layer 102 at the bottom faces.

Further, third grooves 112 formed in the layer 103 and fourth grooves 113 formed in the rear electrode layer 104 communicate with each other so as to form unit light-emitting-element dividing grooves (deepened common grooves) 115 as a whole.

The grooves 115 each have a depth sufficient to reach the layer 104, and preferably sufficient to reach the layer 103.

The device 100 is constituted by separate unit light-emitting elements 120*a*, 120*b*, 120*c*, and so on, formed by zoning the thin layers by the grooves 110 in the conductive electrode layer 102 and the grooves 115 in the functional layer 103 and the rear electrode layer 104 into a plurality of zones.

Figure 15:
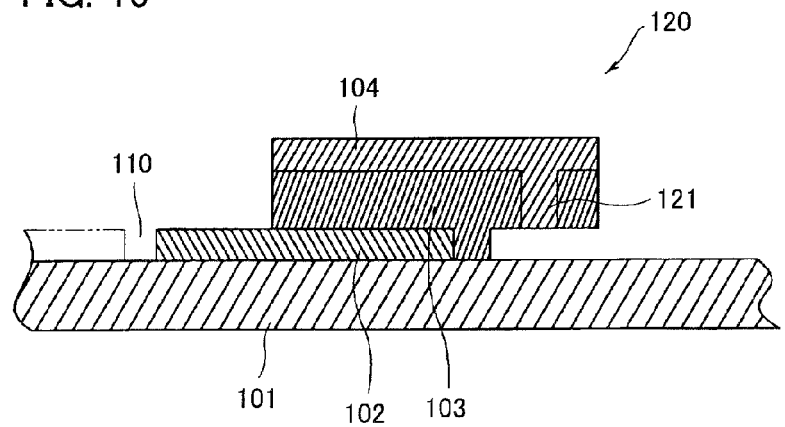
FIG. 15 is a cross section illustrating one unit light-emitting element of an organic EL device of the present invention.

Specifically, as shown in FIG. 15, one unit light-emitting element 120 consists of one of the zones of the conductive electrode layer (first electrode layer) 102 divided by the first dividing grooves 110, a zone of the functional layer (laminated layer) 103 laminated on the one zone of the layer 102, and a zone of the rear electrode layer (second electrode layer) 104 laminated thereon.

As shown in FIGS. 13 and 14, the layer 104 partly penetrates in the grooves 111 and contacts with the layer 102, so that one unit light-emitting element 120*a*, for example, is electrically connected to its adjacent unit light-emitting element 120*b* in series.

Specifically, because the grooves 110 and the grooves 115 are located at different positions, the functional layer (laminated layer) 103*a* and the rear electrode layer (second electrode layer) 104*a* of the one unit light-emitting element 120*a* hang out from the conductive electrode layer (first electrode layer) 102*a* and overhang its adjacent unit light-emitting element 120*b*. A penetrating part 121*a*, which is the part of the layer 104*a* penetrating in the groove 111, contacts with the layer 102*b* of its adjacent unit light-emitting element 120*b*.

As a consequence, the unit light-emitting element 120*a* on the glass substrate 101 is serially connected to the adjacent element 120*b* via the penetrating parts 121*a* of the layer 104*a*.

An electric current supplied from outside flows from the conductive electrode layer 102*a* through the functional layer 103*a* to the rear electrode layer 104*a*. A part of the rear electrode layer 104*a* contacts with its adjacent conductive electrode layer 102*b* via the penetrating part 121*a* in the groove 111, so that the current flows through the unit light-emitting element 120*a*, in which the current firstly flows, to the conductive electrode layer 102*b* of its adjacent element 120*b*. In this way, in the integrated organic EL device 100, all the unit light-emitting elements 120 are electrically connected in series and emit light.

The device 100 is produced by using a vacuum evaporator not shown and a laser scriber not shown.

Specifically, production of the device 100 includes a first step in which the conductive electrode layer 102 is film-formed on the glass substrate 101.

The conductive electrode layer 102 is made of a material such as indium tin oxide (ITO), tin oxide ($SnO_2$), or zinc oxide (ZnO). The conductive electrode layer 102 is formed on the glass substrate 101 by a sputtering method or a CVD method.

Secondly, the first-electrode-layer dividing grooves 110 are formed in the conductive electrode layer 102 by a first laser scribing process.

The laser scriber includes an XY table, a laser generator, and optical components. In the first laser scribing process, the glass substrate 101 is placed on the XY table and linearly moved in a longitudinal direction at a constant speed under application of a laser beam. Then, the XY table is moved in a transverse direction so as to displace an application point of the laser beam and the substrate 101 is linearly moved again in the longitudinal direction under application of the laser beam.

The substrate 101 having undergone the first laser scribing process is washed, in some cases, for removal of dispersed film.

Thirdly, on the resulting glass substrate 101, layers such as the hole injection layer, the hole transport layer, the emission layer, the electron transport layer, and the conductive layer are sequentially deposited so as to form the functional layer (laminated layer) 103.

Fourthly, the substrate 101 having been taken out from the vacuum evaporator, undergoes a second laser scribing process, which forms the emission-layer dividing grooves 111 in the functional layer 103.

Fifthly, the substrate 101 is inserted into the vacuum evaporator, so that the rear electrode layer 104 made of a metal material such as aluminum (Al) or silver (Ag) is laminated on the functional layer 103.

Sixthly, the unit-light-emitting-element dividing grooves 115 are formed in both the rear electrode layer 104 and the functional layer 103 by a third laser scribing process.

Finally, the organic EL device is completed by undergoing steps including formation of a feeding electrode (not shown), formation of dividing grooves (not shown) outside of the electrode, removal of the layer such as the rear electrode layer 104 outside the dividing grooves, and sealing by a sealing part.

Another aspect of this invention is a method for producing the above-mentioned organic EL device and a method for producing an organic light-emitting device having a plurality of light-emitting sections electrically connected in series on a light-transmissive substrate, the method including the steps of:

(a) forming a first conductive electrode layer 102 to be patterned and light transmissive on the substrate (glass substrate 101);

(b) forming a laminated layer (functional layer) 103 containing a plurality of organic-compound layers so that the layer 103 covers at least a part of the first electrode layer 102;

(c) exposing a part of the first electrode layer 102 by removal of a part of the laminated layer (functional layer) 103;

(d) forming at least one layer containing a second conductive electrode layer (rear electrode layer 104) on the laminated layer (functional layer) 103 and the exposed part of the first electrode layer 102; and (e) simultaneously removing a part of the laminated layer (functional layer) 103 and a part of the second conductive electrode layer (rear electrode layer 104) by application of the laser beam from a side of the substrate (glass substrate 101).

The reason why the bottom-emission organic EL device directed by this invention employs the light-transmissive substrate is to emit generated light outside, and thus, the electrode layer formed thereon is required to be light transmissive. However, it is not necessary to be light transmissive on the whole side, and it is sufficient to be only partly light transmissive depending on the purpose. Signages for making people recognize signals by light emission in a specifically shaped area, for example, are only required to be light transmissive in a desirably-shaped area. This invention mainly aims to be applied to large-area illumination, but can be applied to such large-area display elements. A metal grid layer is occasionally formed under or on a light-transmissive conductive layer so as to supplement conductivity, and this invention can be applied also when such a partly light-transmissive first conductive electrode layer is used.

Herein, in this invention, the term "light-transmissive" means to have light-transmitting properties, and more specifically, a transmittance of over about 50% in a visible light range of a light emission range would be sufficient. An indium-doped tin oxide layer is exemplified as the light-transmissive first conductive electrode layer (hereinafter also referred to as the light-transmissive conductive layer), for example.

Further, it is necessary for the light-transmissive conductive layer to be eventually patterned for application of this invention (step (a)). Patterning can be performed by various means. The means include, for example, a method of forming the light-transmissive conductive layer in a patterned manner by means such as screen printing or evaporation through a mask, a method of removing by means such as lift-off, RIE (reactive ion etching), photolithography, a water jet, or a laser beam application after forming the layer, or a combination of these methods. Several conditions such as a low possibility of causing damage, modest processing accuracy, and easy processing are required, but a commonly-known method can be used for patterning.

What is critical is that a plurality of parts of the patterned light-transmissive conductive layer formed by such means have been electrically divided or separated before the laminated layer (functional layer) 103 is formed. These parts eventually function as the light-emitting sections electrically connected in series. Thus, it is preferable to, after the patterning, have a low resistance in each conductive part (conductive electrode layers 102a, 102b, 102c, and so on) and a high resistance between the conductive parts (102a, 102b, 102c, and so on). Further, in order to effectively emit light, the divided conductive parts (102a, 102b, 102c, and so on) preferably have the same area, for they are connected in series. Based on an assumption that the organic-compound layers are evenly formed on the substrate (glass substrate 101 and so on), the highest luminance efficiency is set by the same electric current fed to each part, and the same area of each patterned part. Examples to achieve this most simply include, in a case of a rectangle-shaped substrate, a method of dividing the light-transmissive conductive layer 103 into strips by one or a plurality of lines parallel to one side of the substrate. In this case, the more the number of divisions is increased, the more the first conductive electrode layer 102 perpendicular to the side has a reduced resistance.

The laminated layer (functional layer) 103 formed so as to cover at least a part of the first electrode layer 102 in step (b) is composed, for example, of a plurality of the organic-compound layers and can include layers such as the electron injection layer, the electron transport layer, the hole injection layer, and the hole transport layer in addition to the emission layer. These layers (functional layer 103) form mostly p-n junctions, but may form a plurality of junctions or may include another layer such as a charge generation layer so as to provide better performance by the junctions. The organic-compound layers may possibly include a thin-film alkali metal layer or include an inorganic layer. Where the laminated layer is composed of a combination of layers each capable of emitting light with a small area, this invention may be applied to enlarge the area. Various appropriate forming methods may be selected for the invention depending on the purpose. Specifically, a low molecular weight organic compound may be formed by an evaporation method, a high molecular weight organic compound may be formed by printing, or a metal layer or a metal oxide layer may be formed by a method such as a sputtering method. In order to achieve this invention, the second conductive electrode layer (rear electrode layer 104) is required in addition to the above-mentioned first conductive electrode layer 102, and another conductive layer may be formed, in a later configuration, separately from the second conductive electrode layer on the outermost surface of the laminated layer.

The execution of the next step of "exposing a part of the first electrode layer by removal of a part of the laminated layer" (step (c)) may employ various means. The means include lift-off, RIE, photolithography, a water jet, or the laser beam application used for removing the light-transmissive conductive layer described above, but it is necessary to leave the light-transmissive conductive layer (conductive electrode layer 102) after removing the laminated layer (functional layer) 103, which possibly narrows the range of conditions. Thus, it is necessary, for example, to minimize damage to the light-transmissive conductive layer by controlling the RIE by its etching time, the water jet by its flow rate, and the laser beam by its laser power (mainly at its focal point). This removal of the laminated layer 103 is ultimately intended to electrically connect the first conductive electrode layer 102 with the second electrode layer (rear electrode layer 104) of its adjacent divided element, and thus, it is not necessary to remove the laminated layer by a patterning of continuous lines, unlike the patterning of the first conductive electrode layer 102.

This invention, after "exposing a part of the first electrode layer by removal of a part of the laminated layer" (step (c)), includes "forming at least one layer containing a second conductive electrode layer on the laminated layer and the exposed part of the first electrode layer 102" (step (d)). Here, the second conductive electrode layer formed on the laminated layer and the first conductive electrode layer 102b formed on the substrate form a pair of electrodes between which the laminated layer is interposed. The second conductive electrode layer (rear electrode layer 104a) formed on the exposed part of the first electrode layer 102b functions as a conductive part electrically connecting the first electrode layer 102b formed on the adjacent substrate to the second electrode layer (rear electrode layer 104a) formed on the laminated layer (functional layer 103a). However, immediately after being formed, the second electrode layer is formed on the whole side of the substrate, and thus, needs to be patterned so as to achieve electrical connection in series. In this invention, this is achieved by step (e). Specifically, this is achieved by forming the unit light-emitting-element dividing grooves 115.

Herein, the second electrode layer formed on the laminated layer is not generally required to be light transmissive in a case of an organic EL device of a bottom emission type in which light is emitted from the light-transmissive substrate, but this invention can be applied to a device in which light is emitted from both sides, depending on the purpose, and in such a case, a light-transmissive layer may be employed as the second electrode layer.

This invention is characterized in that the conductive electrode layer 102 is patterned by simultaneously removing a part of the laminated layer and a part of the second electrode layer under application of a laser beam from a side of the light-transmissive substrate. Except in the above-mentioned case of light emission from both sides, it is desirable that the second electrode layer not be a light-transmissive conductive electrode for lowered resistance of the whole element. Particularly, it is effective to use a highly-reflective second electrode layer for increasing the intensity of light emission from a side of the substrate. Generally, the second electrode layer employs a highly-reflective metal thin film or a multilayer film containing the metal thin film, which has a thickness sufficient to prevent visible light from transmitting, exemplified by an Ag film formed by an evaporation method. Therefore, in application of a laser beam from a side of the second electrode layer and in a case of small energy density, the laser beam is mostly reflected and, being unable to effectively heat the electrode layer, fails to remove the electrode layer. Further, increased beam intensity melts the metal layer forming the second electrode layer, resulting in a small reflectance and rapid absorption of a large energy. That absorption causes damage to the second electrode layer and even the first electrode layer due to energy from the laser beam, rendering the desired patterning impossible. In sum, it is difficult to appropriately control the energy density of the applied laser beam, and thus, an appropriate processing method cannot be practically found.

On the other hand, in a case of application of the laser beam from a side of the light-transmissive substrate (glass substrate 101), even in a case of small energy density, energy is rarely absorbed in the substrate, but is absorbed in the organic-compound layers and the conductive electrode layer 102, which are removed since the temperature is increased at the periphery of the laser beam application. In this case, it is not always necessary to sublimate the second electrode layer because the second electrode layer is located on the organic-compound layers and the conductive electrode layer 102, and so is removed together with those layers. Further, the removal with a low energy density avoids damage to the first electrode layer (conductive electrode layer 102). In sum, it is possible to appropriately control the energy density of an applied laser beam, and thus, an appropriate processing method can be easily found.

Another preferred embodiment of this invention is a method in which step (a) includes a step of removing a part of the first electrode layer by application of a laser beam after forming the first electrode layer (conductive electrode layer 102) on the substrate. As previously mentioned, the method for obtaining the patterned first electrode layer (conductive electrode layer 102) includes the method of forming the light-transmissive conductive electrode layer in a patterned manner by means such as screen printing or evaporation through a mask, the method of removing by means such as lift-off, RIE, photolithography, a water jet, or a laser beam application after forming the layer, and the combination of these methods. Most of the methods have problems in processing accuracy, area enlargement, productivity, and cost. It may be said that the method of patterning the layer using a laser beam is the most reasonable one. As described above, this invention is characterized in that the second electrode layer is patterned by laser processing in step (e). Hence, it is reasonable to use a means having processing accuracy equivalent to that for the patterning of the first electrode layer (conductive electrode layer 102). The processing accuracy materially affects a yield rate of products, an effective area, and the like. Although higher accuracy won't degrade performance, there is no need to provide extremely high accuracy. It is not preferable to increase costs. Additionally, use of the same means provides an advantage of considerable simplification of alignments in the processes.

Another preferred embodiment of this invention is a method in which the laminated layer has an outermost layer farthest from the substrate, the outermost layer being a conductive thin-film layer.

In sum, it is preferable to provide the conductive thin-film layer located next to the second electrode layer and being different from the second layer.

The layer constituting the laminated layer and being farthest from the substrate, i.e., the outermost layer at the time when the laminated layer has been formed, has little effect on the electrical connection of the elements in series, in principle, even if the layer is either a metal layer or a metal oxide layer having conductivity in a film-surface direction, or an organic-compound semiconductor layer. However, the use of a metal thin-film layer or a metal oxide thin-film layer having a stability higher than the organic-compound layer as the outermost layer conclusively provides for a reliable organic EL device.

The difference is not clear, but is possibly caused by moisture intrusion and a problem with reliability between the organic-compound layer and a metal layer or a metal oxide layer. The organic-compound layer is easily influenced by humidity, oxygen, and electronic instability or plasma instability, and temperature increases associated with these factors. Processing or film-formation after covering the surface with a stable layer is effective to ensure characteristics and reliability after production, as compared to leaving the organic-compound laminated layer at the outermost layer after the formation of the laminated layer. Particularly, the effects are pronounced when the processing atmosphere cannot be maintained at adequately low humidity and adequately low oxygen conditions.

Another preferred embodiment of this invention is a method in which "exposing a part of the first electrode layer by removal of a part of the laminated layer" (step (c)) includes a step of applying a laser beam onto the laminated layer. Such a method of removing a thin film, as exemplified in the method of removing the light-transmissive conductive layer, includes the method of removal by means such as lift-off, RIE, photolithography, a water jet, or a laser beam application and combinations thereof. Most of these methods similarly have problems in processing accuracy, area enlargement, productivity, and cost. Additionally, it is desired to minimize damage to the first electrode layer to be exposed in the removal of the laminated layer. Therefore, the method of partly removing the laminated layer using a laser beam is most reasonable. Since this invention is characterized in using laser processing for patterning of the second electrode layer, for processing accuracy the use of the same means, as in the case of the patterning of the first electrode layer (conductive electrode layer 102), is preferable and similarly provides an advantage of considerable simplification of alignments in the processes.

A preferred embodiment of this invention is a method in which the step of applying the laser beam for partly removing the laminated layer is done from a side of the substrate. Since the laminated layer is composed of layers having relatively low reflectance unlike the second electrode layer, the application of the laser beam directly from a side of the laminated layer sublimates the laminated layer due to temperature increase by absorption by the laminated layer, thereby removing the layer. However, in this case, the laminated layer adjacent to the conductive electrode layer may not be completely removed because the laminated layer is heated from its surface. That incomplete removal may fail to fully lower the electrical resistance between the adjacent conductive electrode layer and the second electrode layer.

The laminated layer (functional layer 103) is located between the first electrode layer 102 and the second electrode layer. In the organic EL device 100, it is necessary to electrically connect the first electrode layer 102 and the second layer so as to connect the unit light-emitting elements in series. Therefore, portions to be connected each preferably have a low resistance.

In this invention, the first electrode layer 102 and the second electrode layer are electrically connected by penetration of a part of the second electrode layer in the grooves (emission-layer dividing grooves 111) formed by removal of the laminated layer. More specifically, a protruding part of the second electrode layer is brought into contact with the first electrode layer 102 at the bottom face of the grooves (emission-layer dividing grooves 111), thereby electrically connecting the first electrode layer 102 to the second electrode layer. In a case where the laminated layer adjacent to the first electrode layer 102 is not completely removed, a residue remains between the first electrode layer 102 and the second electrode layer, resulting in an increase in electrical resistance therebetween.

Power-up of the laser beam used for completely removing the laminated layer may cause more damage to the first electrode layer 102, resulting in a narrowing of a range of conditions for ideal removal.

In contrast, in a case of application of a laser beam from a side of the substrate, the laminated layer adjacent to the first electrode layer 102 is firstly heated and sublimated, so as to be removed from the first electrode layer 102 with low power that causes less damage to the first electrode layer 102. Therefore, it allows ideal removal in a wider range than that obtained by the application of the laser beam from a side of the laminated layer.

More conveniently, the conditions are similar to those of the laser beam employed in recommended step (e), and as a result a laser processing machine or the like can be shared.

More specifically, this invention includes a step (e), which is common with the recommended method in step (c) in formation of the grooves by laser beam application.

The conditions in step (c) are almost the same as those in recommended step (e). The difference between steps (c) and (e) is the existence of the second electrode layer during laser scribing.

Therefore, the laser processing machine or the like can be shared by replacing, for example, an output power of the laser beam in removal of the laminated layer in step (c) by an output power capable of removing not only the laminated layer but also the second electrode layer into gasified ablated components similar to step (e).

In sum, regardless of existence or nonexistence of the second electrode layer, the processing of step (c) and the processing of step (e) can be performed under the same conditions, and this is preferable for ease of setting conditions, and ease of choice of laser processing machines, etc.

Another preferred embodiment of this invention is a method in which the laser beam used in "simultaneously removing a part of the laminated layer and a part of the second conductive electrode layer" (step (e)) has a light source of a high harmonic of a neodymium YAG laser. In this invention, it is desirable to protect the first electrode layer 102 from damage, in simultaneously removing a part of the laminated layer and a part of the second electrode layer. That is why the applied laser beam is required to be largely absorbed in the laminated layer and less absorbed in the first electrode layer 102. The neodymium YAG laser is widely used in industry, so it is easily available, and can have an extremely high power density by pulsed oscillation, with pulses of short duration, being a laser having high machining performance. The YAG laser has a fundamental harmonic wavelength of 1064 nm. Light having a high harmonic wavelength of 532 nm or 355 nm is less absorbed in a light-transmissive conductive material such as ITO, so it is suitable for removing the laminated layer without damaging the first electrode layer 102. Particularly, the second high harmonic is comparatively widely used as a laser light source, being suitable for use in a processing device.

A further preferred embodiment of this invention is a method in which the laser beam used in step (c) has a light source of a high harmonic of a neodymium YAG laser. As previously mentioned, the conditions of the laser beam application for removing a part of the laminated layer can be set almost similarly to those for removing the second electrode layer (step (e)). Therefore, similar to the above description, it is preferable that the laser light source is a high harmonic of a neodymium YAG laser. Particularly, this light source is more preferably used in laser beam application from a side of the substrate.

A further preferred embodiment of this invention is a method in which step (a) includes a step of removing a part of the first electrode layer by applying a laser beam using a fundamental harmonic of a neodymium YAG laser as a light source after forming the first electrode layer on the substrate.

The method of applying a laser beam is suitable in patterning of the first electrode layer 102, as described above. At this time, it is necessary for the laser beam to be converted to heat energy by being absorbed in the first electrode layer 102, and thus, it is an essential condition to have an absorption wavelength in the first electrode layer 102. As previously mentioned, the neodymium YAG laser has a fundamental harmonic of 1064 nm, and is largely absorbed in the first electrode layer 102 made of a material such as ITO or tin oxide. Further, unlike the high harmonic, it is easy to obtain a high energy density using the fundamental harmonic, which has a relatively low absorption coefficient. Additionally, performing step (a), using the same or similar laser processing machine with that used in steps (c) and (e), facilitates having a controlled and accurate overall process. In some cases, steps (a), (c), and (e) can be performed using the exact same light source by devising of using a high harmonic unit.

Another preferred embodiment of this invention is a method including a step of applying a voltage onto at least a part of each of the light-emitting sections on the substrate in a reverse direction after "simultaneously removing a part of the laminated layer and a part of the second conductive electrode layer by application of the laser beam from a side of the substrate" (step (e)), so as to reduce a leakage current from the light-emitting sections. "Simultaneously removing a part of the laminated layer and a part of the second conductive electrode layer by application of the laser beam from a side of the substrate" (step (e)) aims to electrically divide the second conductive electrode layer into the light-emitting sections. Insufficient electrical division at this step generates a leakage current between the first and the second electrode layers in each section, resulting in reduced light-emitting properties. The insufficient electrical division is attributed to a defect such as an insulation failure between adjacent sections of the second electrode layer, an electrical short by contacting of the second electrode layer with the first electrode layer, or a micro defect in the organic-compound laminated layer. Hence, this step aims to use heat to eliminate such defects. The heat is generated by providing a large potential difference in between the first and the second electrode layers in each section so as to concentrate high current on a portion where the leakage current is generated. The voltage application in a forward direction can also execute this step, but may allow current to flow in not only the defective portion, but also the other portions to a certain extent, making it difficult to control the process locally. Specifically, when the same voltage is applied during processing, the level of performance recovery is reduced.

Another preferred aspect of this invention is a method including a step of bringing at least a part of the removed part into contact with a fluid after "simultaneously removing a part of the laminated layer and a part of the second conductive electrode layer by application of the laser beam from a side of the substrate" (step (e)) so as to reduce a leakage current from the light-emitting sections.

One of the main causes of the above-mentioned insufficient electrical division caused by the defects described above is a slight residue of the second electrode layer. Even slight removal of the residual second electrode layer shows an improvement in a light-emitting property. Concerning removal methods, a mechanical removal method is effective in addition to the method of utilizing heat generated by the current as described above. Specifically, possible methods include sticking an adhesive material on the residual electrode layer and stripping it off, or blowing a fluid on the residual electrode layer at high pressure, the latter method being effective because of less damage to the elements. In addition, a fluid without moisture is preferable because it is thought that organic-compound semiconductor reliability decreases in the presence of moisture. More specifically, it is possible to apply a dry inert gas such as dry nitrogen or argon, a non-aqueous organic solvent, or the like. In the case of using liquids, it is effective use ultrasonic treatment with liquid immersion in addition to the method of blowing fluid.

Since the grooves 115 divide the layered product on the glass substrate 101 into the separate unit light-emitting elements 120a, 120b, 120c, and so on, the second electrode layer belonging to one unit light-emitting element 120a and the second electrode layer belonging to its adjacent unit light-emitting element 120b should be cleanly divided by one groove 115.

In the event that the second electrode layer 104a belonging to the one element 120a and the second electrode layer 104b belonging to the adjacent element 120b remain connected, even partly, a current flowing in the second electrode layer 104a will be allowed to flow into the element 120c located next to element 120b, skipping the element 120b. As a result, the current does not flow in the element 120b, which then fails to emit light.

Further, it is preferable that the functional layer 103a belonging to one unit light-emitting element 120a, and the functional layer 103b belonging to its adjacent unit light-emitting element 120b, are divided by the groove 115. In the event of incomplete division, current will be allowed to flow between those layers, reducing the current flow in element 120b, and eventually, causing the element 120b to emit less light than the other elements.

In contrast, the first electrode layer 102 should not be divided by the grooves 115.

As described above, in the integrated organic EL device 100, the functional layer (laminated layer) 103a and the rear electrode layer (second electrode layer) 104a belonging to one unit light-emitting element 120a protrude from the conductive electrode layer 102a, and this protruding portion overhangs a conductive electrode layer 102b of an adjacent unit light-emitting element 120b, so that the rear electrode layer (second electrode layer) 104a belonging to the element 120a is electrically connected to the layer 102b belonging to the element 120b.

Division of the layer 102 into the element 120a by the grooves 115 fails to connect the rear electrode layer (second electrode layer) 104a belonging to the element 120a with the functional layer belonging to its adjacent element 120b, resulting in disconnection of those elements.

Therefore, the first electrode layer 102 should not be divided by the grooves 115.

As described above, the grooves 115 are necessary to surely divide at least the rear electrode layer (second electrode layer) 104, while the grooves 115 should not divide the first electrode layer 102.

On the other hand, the functional layer (laminated layer) 103 includes the emission layer therewithin, and necessarily transmits light emitted by the emission layer toward the glass substrate, and thus should have a light transmissivity on some level.

In the laser scribing, when the laser beam is focused on the functional layer (laminated layer) 103, the laser beam penetrates through the layer 103 and then reaches the rear electrode layer (second electrode layer) 104, which causes less ablation. As a result, the rear electrode layer 104 might not be completely divided.

A preferred embodiment of this invention for solving this problem is a method in which the laser beam 25 used in simultaneously removing a part of the laminated layer and a part of the second conductive electrode layer in step (e) is applied in pulses entering from the substrate (glass substrate 101) and has a focal point 26 at a position located short of the functional layer 103.

Figure 16:
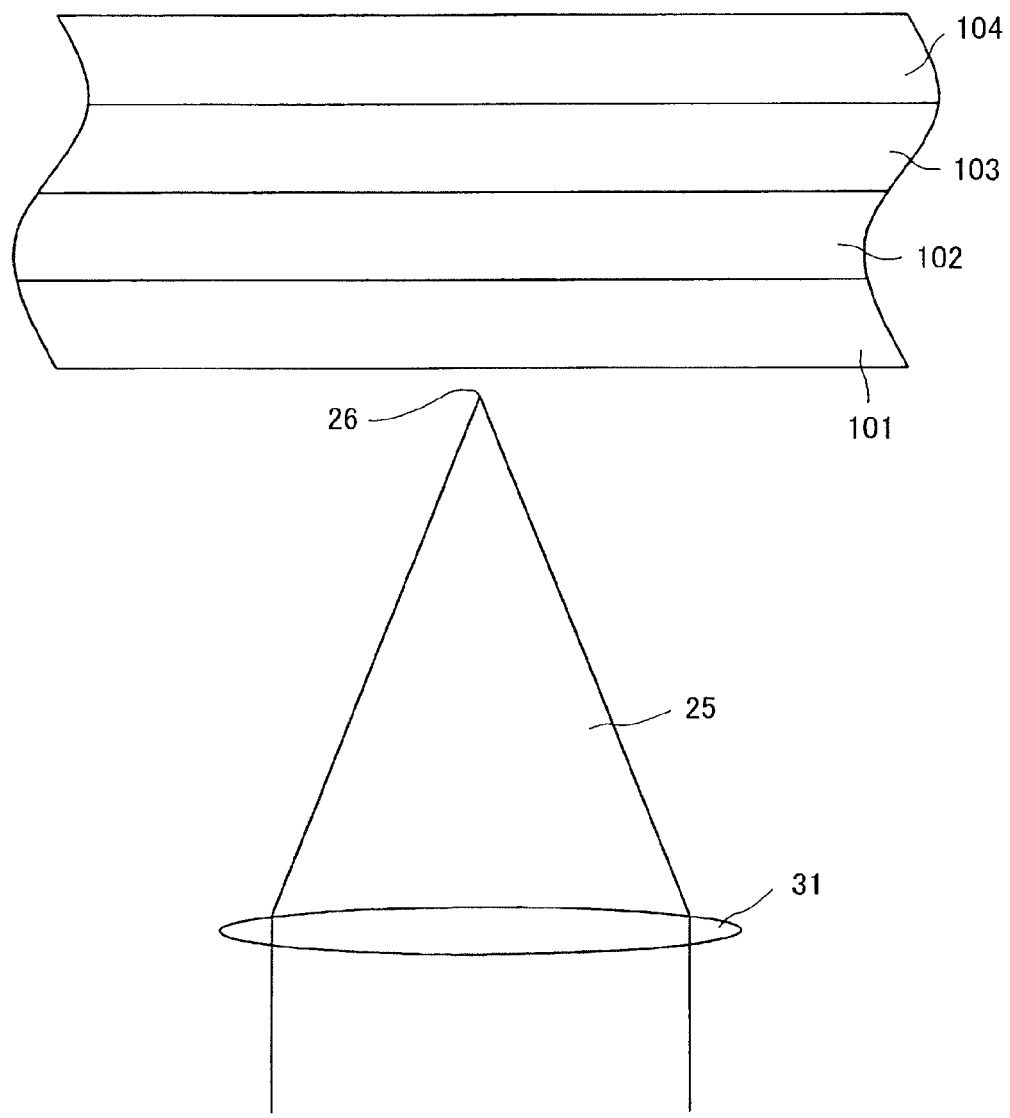
FIG. 16 is an explanatory diagram showing a focus of a laser beam in producing an organic EL device of the present invention.

For favorable processing, the focal point 26 is preferably put on a position located short of the layer 102 and more preferably short of the glass substrate 101, as shown in FIG. 16.

Another embodiment for solving the same problem is the method in which step (e) is performed by applying the pulsed laser beam 25 from the side of the substrate (glass substrate 101), while relatively moving an application point of the laser beam 25 to draw a linear trajectory at a constant speed, in which the laser beam has a pulse strength and the speed satisfying a relationship, in which a number of small holes 28 formed by the pulses of the laser beam 25 each have a shape increasing in diameter from the substrate toward the second electrode layer, so that the laminated layer and the second electrode layer are divided by the small holes 28, which overlap, and that the first electrode layer (conductive electrode layer 102) has a conductive part 30 between the small holes 28, which do not overlap.

Now, these embodiments will be described in detail below.

When the grooves 115 are formed by a laser scribing method, the laser beam 25 is focused with a lens 31. At this time, as shown in FIG. 16 for example, the laser beam 25 has a focal point 26 at a position nearer to its light source than the functional layer 103 and is applied in pulses.

Figure 18:
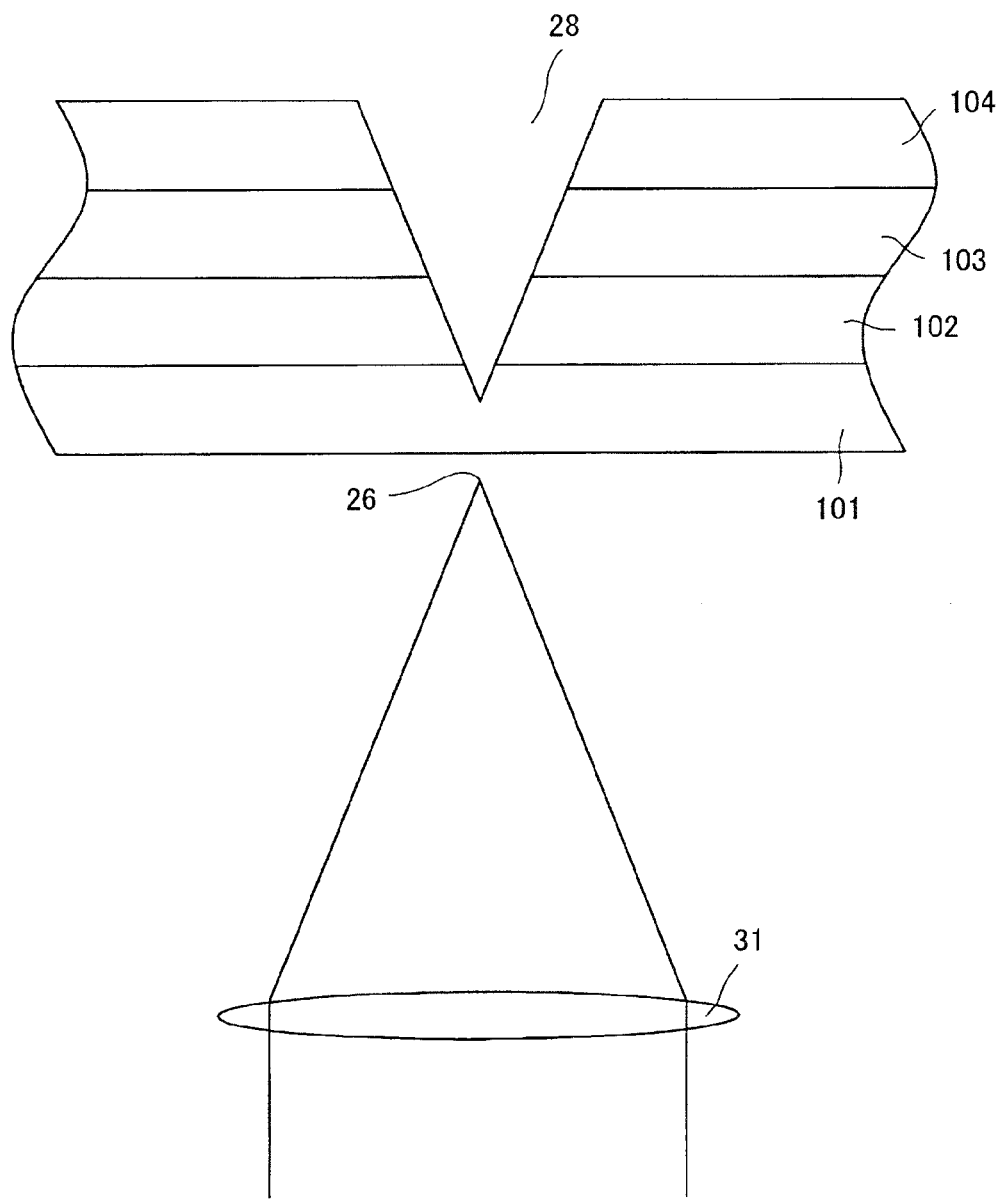
FIG. 18 is a view associated with FIG. 16 and an explanatory diagram showing a hole formed by a laser pulse.
Figure 21:
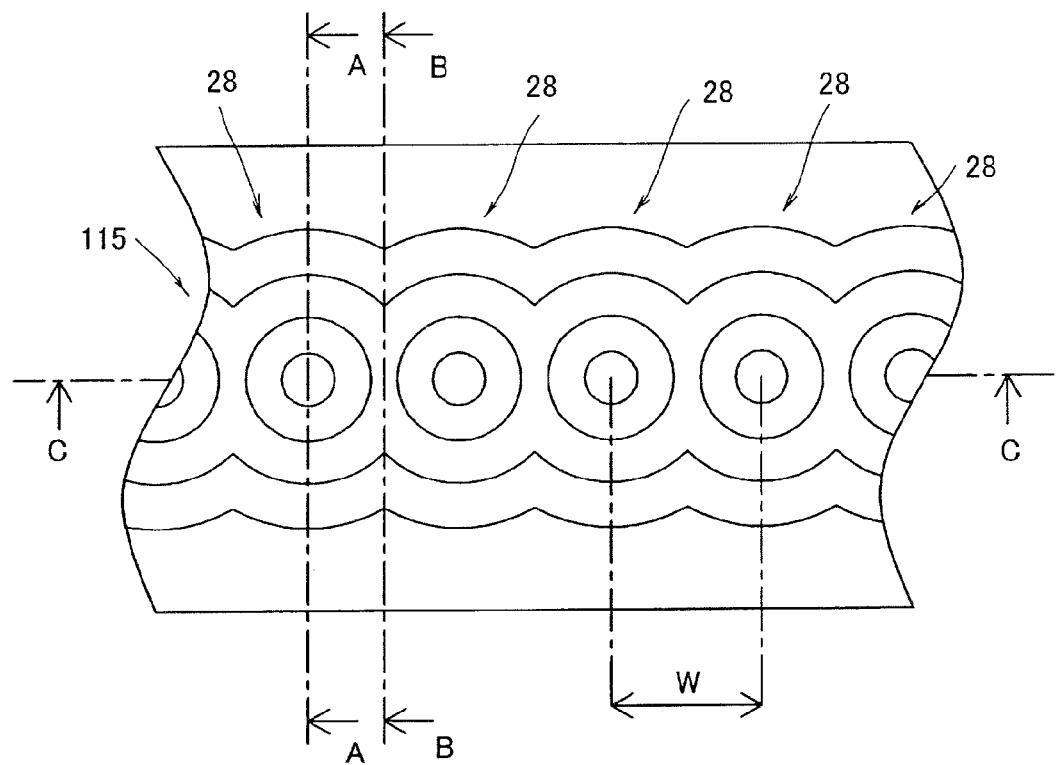
FIG. 21 is an enlarged plan view of a unit light-emitting-element dividing groove in an organic EL device of the present invention.

One of the pulses of the pulsed laser beam 25 has a focal point 26 at a position slightly outside the glass substrate 101, as shown in FIG. 16, in a direction toward a light source from the functional layer 103 (downwardly in FIG. 16). The laser pulse ablates a part of the glass substrate 101, the first electrode layer 102, the functional layer 103, and the rear electrode layer 104 overlapping the substrate 101, thereby forming the hole 28 as shown in FIGS. 18 and 21. The first electrode layer 102 on the glass substrate 101 and the functional layer 103 adjacent thereto particularly increase in temperature, ablating explosively.

Herein, the laser focal point 26 may be positioned within the glass substrate 101.

As previously mentioned, the light-transmissive conductive material absorbs little light having a high harmonic wavelength of the YAG laser, 532 nm for example. The laminated layer 103 containing the organic EL elements also absorbs little light having such a wavelength, since it is made of materials that are basically transparent and has a thickness of around 50 nm to 200 nm, which is not so thick. Consequently, particularly in forming the unit light-emitting-element dividing grooves and the vias, it is more efficient to ablate the conductive electrode layer 102 by increasing the temperature than to ablate the laminated layer 103 by directly heating it to a high temperature using a laser. An embodiment of this idea is one of the characteristics of this invention.

On the other hand, laser processing of, for example, an amorphous silicon layer and a rear electrode layer, each being a thin-film photoelectric conversion element containing amorphous silicon as a photoelectric conversion layer, is sufficiently performed by heating and ablating the amorphous silicon since the amorphous silicon sufficiently absorbs light of 532 nm and has a layer thickness of around 250 nm to 500 nm, which is modestly thick. That is the major difference between processing an organic EL laminated body and processing an amorphous silicon layer.

In sum, the actual number of photoelectric conversion elements including amorphous silicon which correspond to the small holes in the first electrode layer of this invention is 30% or less at most and generally 15% or less, whereas the actual number of the organic EL elements which correspond to the small holes in the first electrode layer of this invention is at least 70% or more and generally 85% or more.

The small holes 28 formed by ablation each are substantially conical in shape, as shown in FIGS. 18, 21, 22, and 25, due to the explosion pressure of the ablation of the glass substrate 101.

Figure 17:
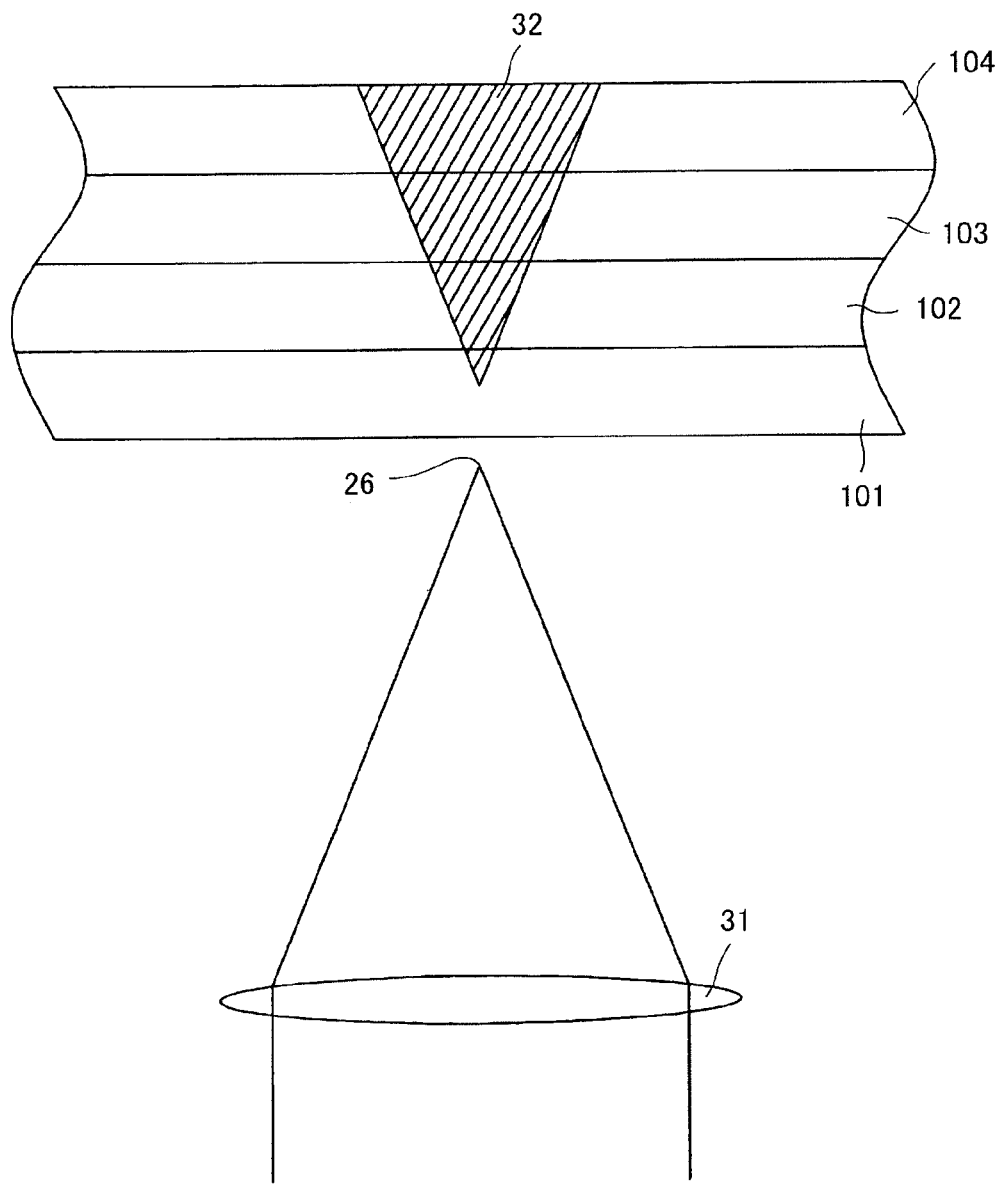
FIG. 17 is a view associated with FIG. 16 and an explanatory diagram showing an extent of pressure when a glass substrate is ablated.

Specifically, the explosion pressure is exerted on a hatched portion 32 shown in FIG. 17, the portion 32 being lost and forming the hole 28 having a conical shape as shown in FIGS. 18, 21, 22, and 25.

The linear movement of an application point of the laser beam sequentially moves an application point of the laser pulse.

Figure 19:
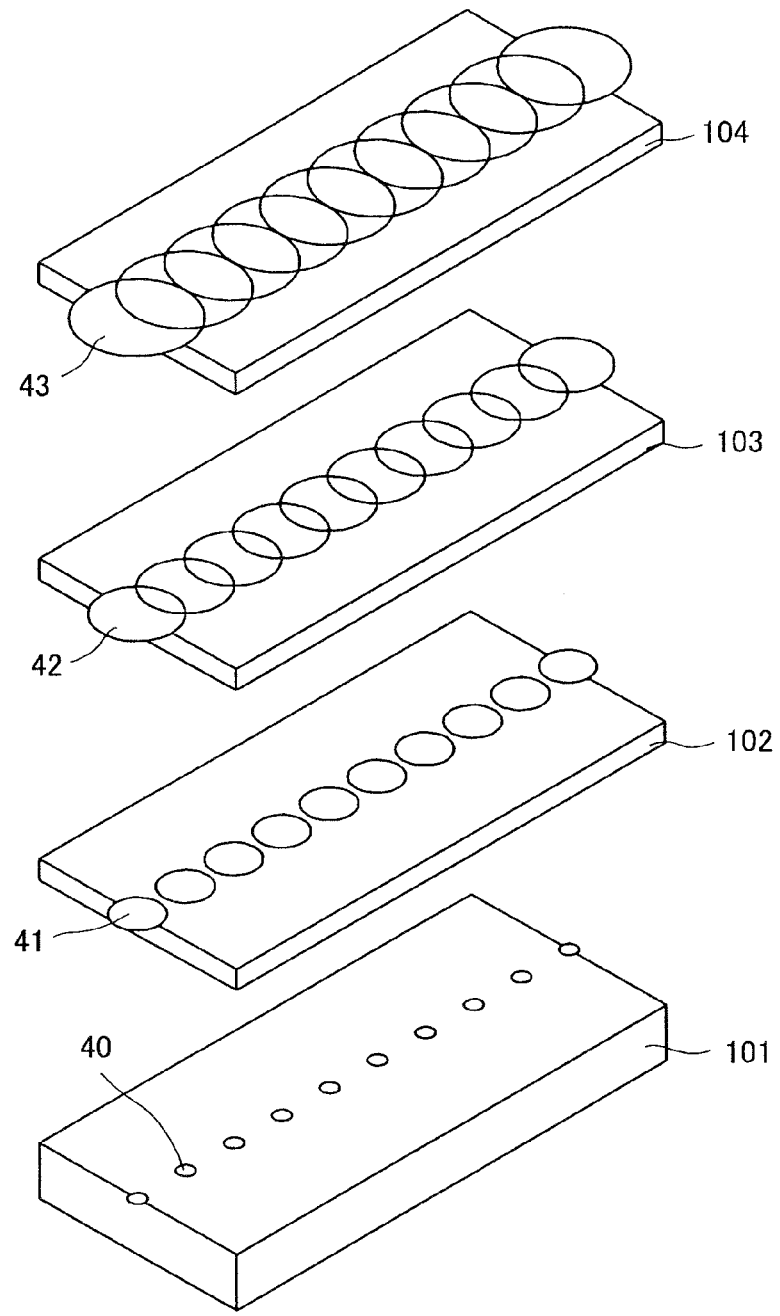
FIG. 19 is an explanatory diagram showing an extent of pressure in each layer when the glass substrate is ablated during formation of a unit light-emitting-element dividing groove.
Figure 20:
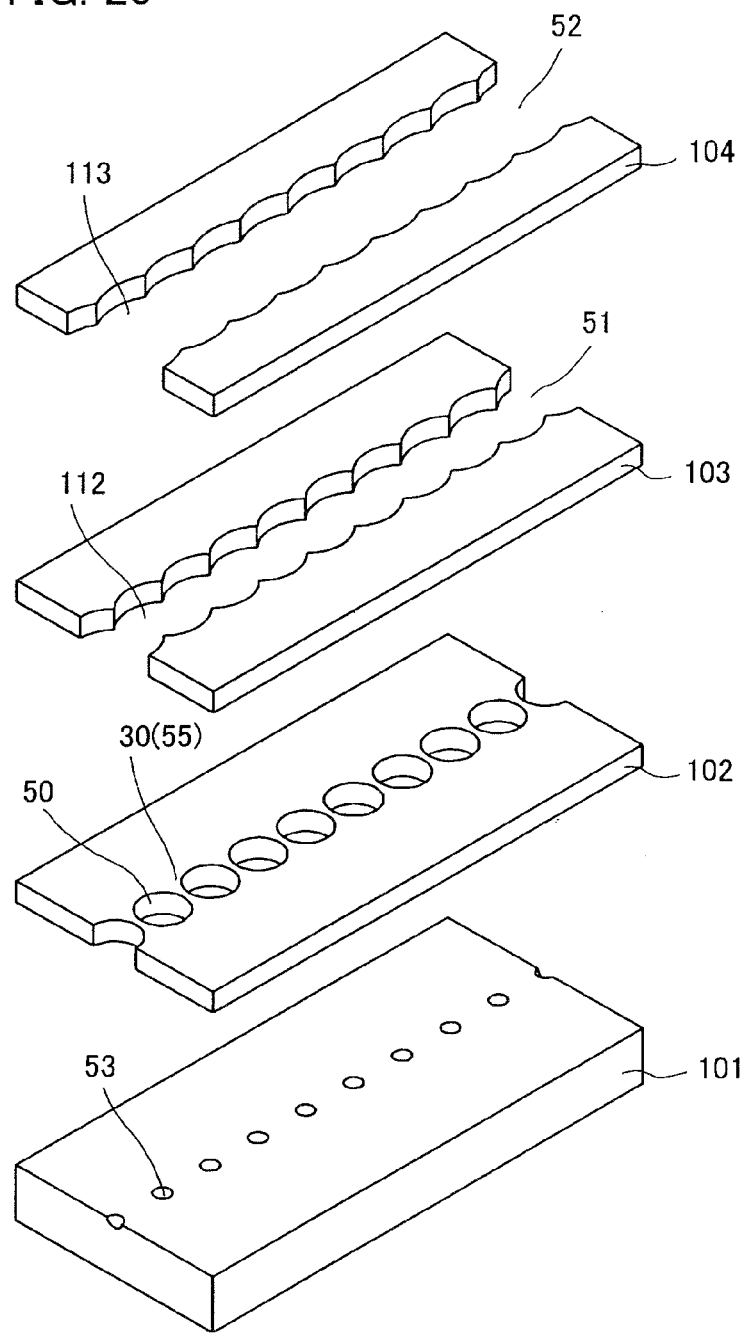
FIG. 20 is an explanatory diagram showing a unit light-emitting-element dividing groove separated by layers.

As a consequence, as shown in FIG. 19, the explosive pressure exerted in the respective layers sequentially moves to regions 40, 41, 42, 43, and in each layer, as shown in FIG. 20, openings 50, 51, and 52 and holes 53 are formed.

Specifically, referring to FIG. 20, the small holes 53 are discontinuously formed in the glass substrate 101.

The openings 50 larger than the holes 53 are formed in the conductive electrode layer 102 in a discontinuous manner, without overlap. Thus, the conductive electrode layer 102 has a residual part 55 between the openings 50.

In contrast, the openings 51 formed in the functional layer 103 are larger than the openings 50 with overlap as shown in FIG. 20, thereby forming a continuous groove 112. In other words, the openings 51 are connected to their adjacent openings 51, having no residual portion.

The openings 52 formed in the rear electrode layer 104 are further larger than the above-mentioned openings, and overlap by about 40 to 80%. The overlapped openings 52 form a groove 113 in the rear electrode layer 104.

Figure 22:
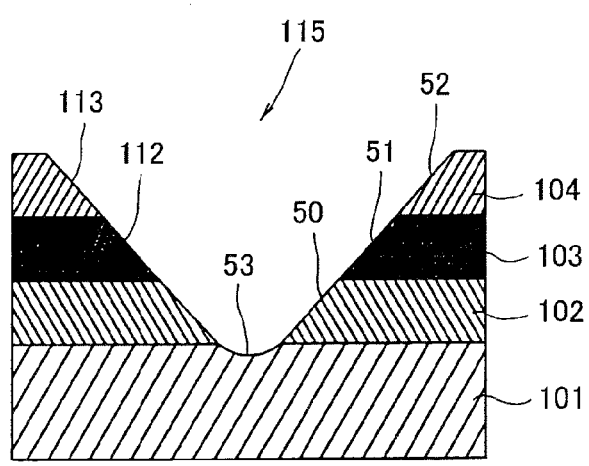
FIG. 22 is a cross section taken along a line A-A in FIG. 21.
Figure 23:
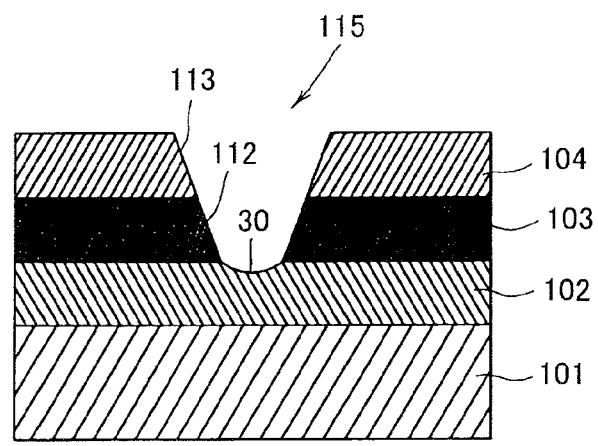
FIG. 23 is a cross section taken along a line B-B in FIG. 21.
Figure 24:
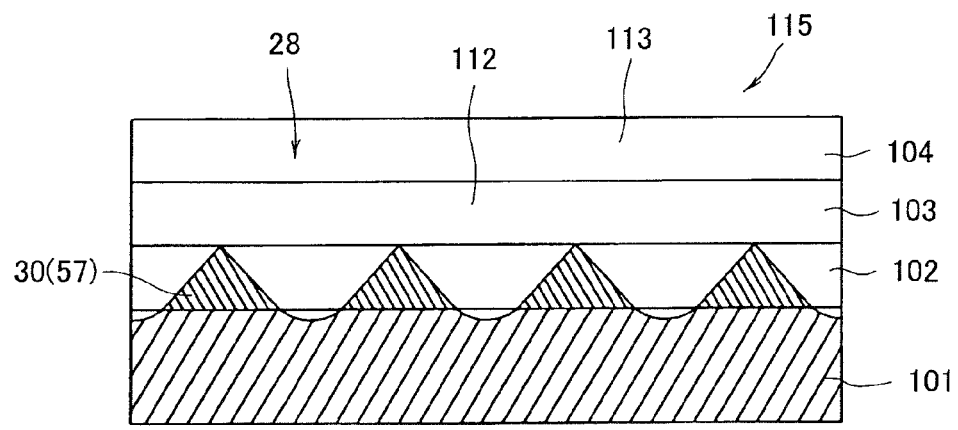
FIG. 24 is a cross section taken along a line C-C in FIG. 21.

Consequently, as shown in FIG. 22, the conductive electrode layer 102 appears divided, as viewed in a cross section of the unit light-emitting-element dividing groove 115 cut along a transverse direction at the center of the hole 28. On the other hand, as shown in FIG. 23, the layer 102 is not divided in a cross section of the groove 115 cut along a transverse direction at the middle portion between the holes 28.

Figure 25:
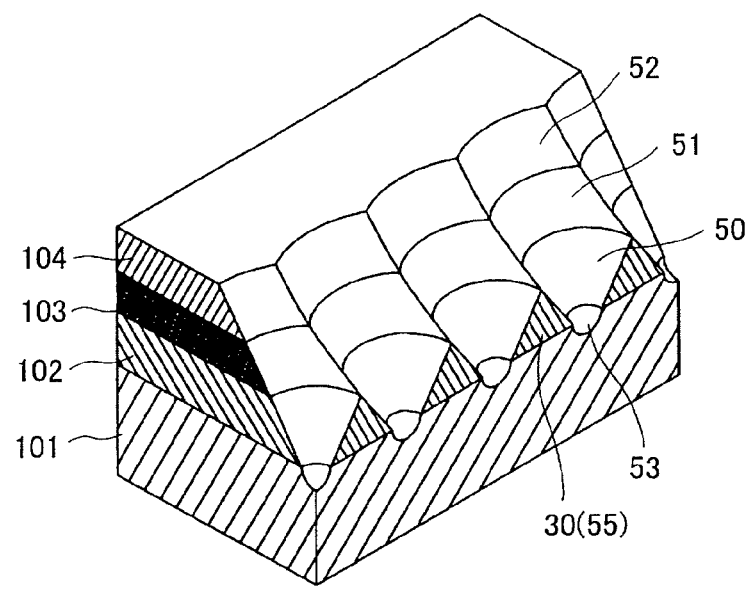
FIG. 25 is a sectional perspective view of a unit light-emitting-element dividing groove in an organic EL device in the present invention.

From another viewpoint, as shown in FIG. 25, the layer 102 is connected at constant intervals within the groove 115 in a cross section cut along the center of the groove 115.

Figure 26:
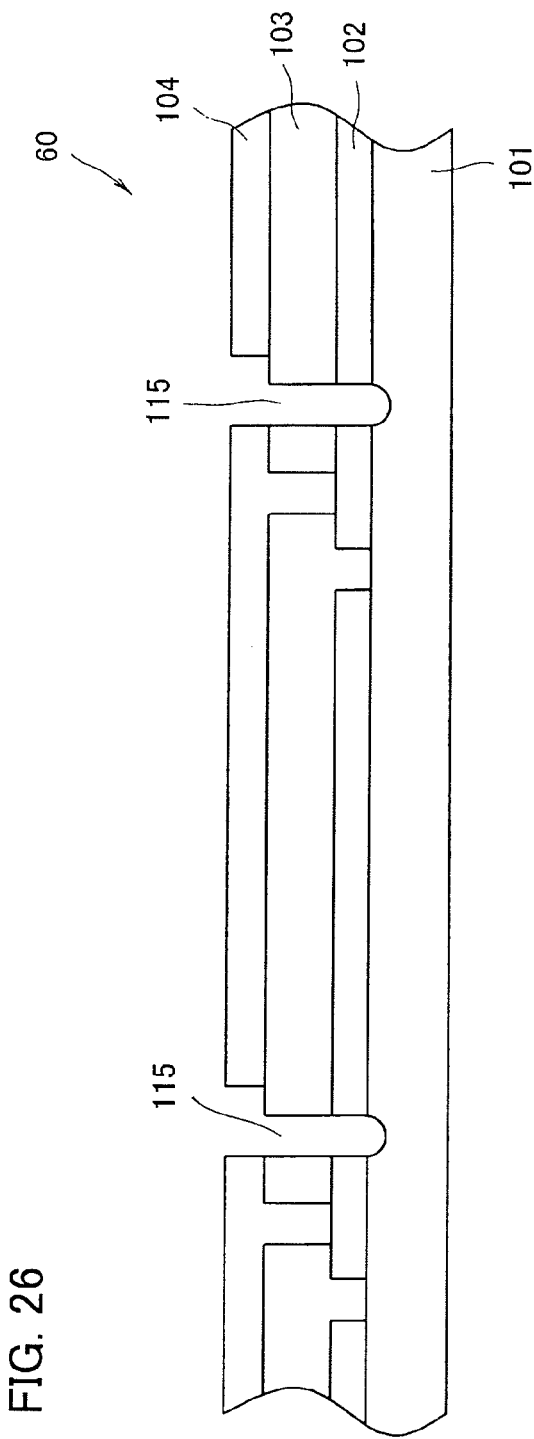
FIG. 26 is a cross section of an organic EL device in the present invention produced by undergoing the process shown in FIG. 16 and cut at the same line A-A in FIG. 22.
Figure 27:
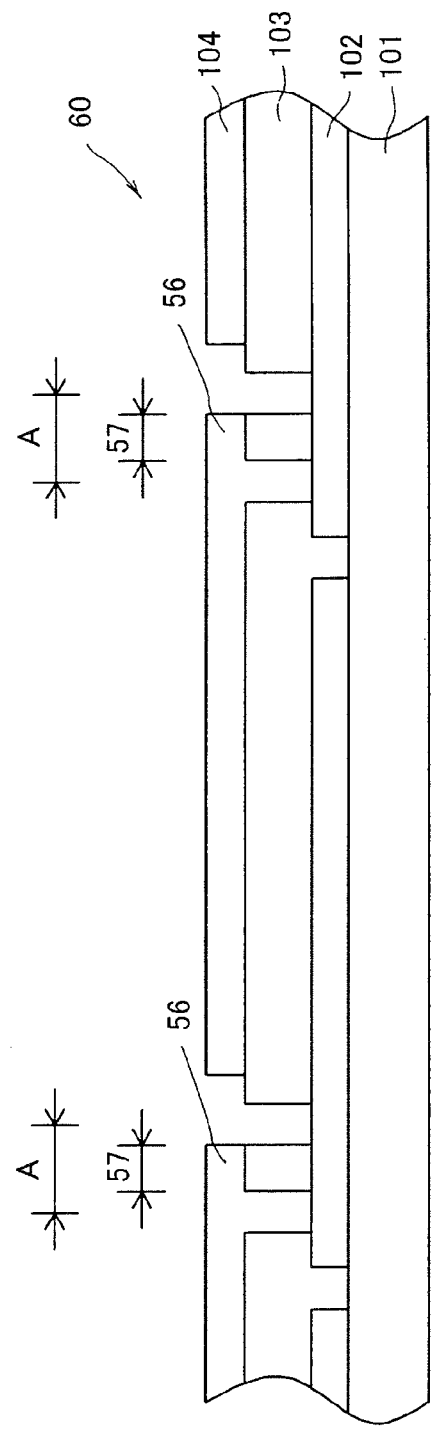
FIG. 27 is a cross section of an organic EL device in the present invention produced by the process shown in FIG. 16 and cut at the same line B-B in FIG. 23.

In a broader view, the conductive electrode layer 102 is divided in the center of the hole 28 as shown in FIG. 26, but the unit light-emitting elements 120 are serially connected in the middle portion between the holes 28 as shown in FIG. 27.

Therefore, all the unit light-emitting elements 120 emit comparable light.

The following embodiment is recommended as a means to divide cleanly the rear electrode layer (second electrode layer) 104 by the grooves 115. The below-described method is not contrary to the above-mentioned methods and it is desirable to use both methods.

Another preferred embodiment of this invention is a method in which step (c) is performed by applying the laser beam 25 onto the laminated layer by relatively moving an application point of the laser beam 25 to draw a linear trajectory and step (e) is also performed by forming grooves by relatively moving an application point of the laser beam 25 to draw a linear trajectory, the linear trajectories having a distance A of 130 micrometers or less between centers of the trajectories, and the method including a step of removing portions 56 of the second electrode layer 104, each located adjacent to the grooves after step (e).

The following embodiment is based on facts discovered in studies conducted by the inventors.

Figure 29:
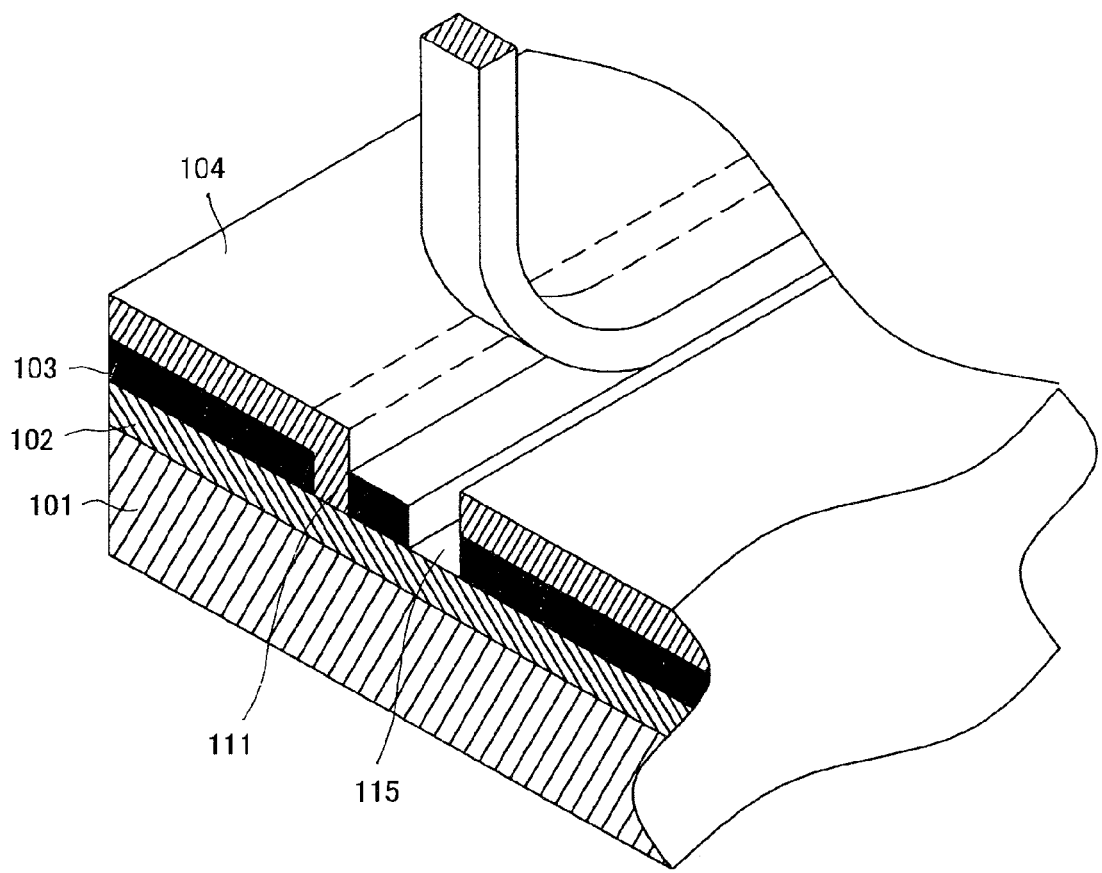
FIG. 29 is a sectional perspective view of an organic EL device of the present invention in one step of the production process of the present invention, in which abrasion of part of a rear electrode layer is performed and after a unit light-emitting-element dividing groove is formed.

Specifically, the integrated organic EL device 100 was experimentally produced by forming the emission-layer dividing grooves 111 and the unit light-emitting-element dividing grooves 115 using their respective laser scribing methods, while changing the distance between the grooves. It was revealed that a portion of the rear electrode layer 104 between the grooves 111 and 115 is removed as a ribbon as shown in FIG. 29 in a case where the distance between the grooves 111 and the grooves 115 is narrow.

Hence, the distance A between the trajectories of the laser beam 25 used in forming the grooves 111 and grooves 115 was made to be 130 micrometers or less, and portions 57 between the trajectories were sucked out and removed after forming the grooves 115. Removal of portions 57 by static electricity is also possible in a preferred embodiment.

As a result, the widths of the fourth grooves 113 formed on the rear electrode layer (second electrode layer) 104 are increased, thereby reducing an electrical short between the unit light-emitting elements 120.

This invention is an organic light-emitting device produced by any of the above-mentioned methods. Despite being a large-area device, the organic light-emitting device produced by these methods will not have a greatly-reduced light-emitting property as compared with a small-area device.

Further, an organic EL device 60 produced by the production method described in FIGS. 16 to 26 is, as well as the above-mentioned basic configuration in FIG. 13, composed of a conductive electrode layer (a first electrode layer) 102, a functional layer (laminated layer) 103 containing at least an organic EL light-emitting layer, and a rear electrode layer (a second electrode layer) 104 sequentially laminated on a glass substrate 101.

First-electrode-layer dividing grooves (first grooves) 110 formed in the layer 102 so as to divide the layer 102 into a plurality of parts are provided. Emission-layer dividing grooves (second grooves) 111 formed in the functional layer 103, so as to divide the layer 103 into a plurality of parts are also provided. Additionally, the rear electrode layer 104 partly penetrates into the grooves 111, so as to contact with the conductive electrode layer 102 at bottom faces of the grooves 111. The grooves 111 are vias (i.e., openings for electrical connection) formed in the functional layer (laminated layer) 103, so that the layer 104 partly penetrates in the vias and makes contact with the layer 102 at the bottom faces.

Further, third grooves 112 formed in the functional layer 103 and fourth grooves 113 formed in the rear electrode layer 104 communicate with each other so as to form unit light-emitting-element dividing grooves (deepened common grooves) 115 as a whole.

The grooves 115 have a depth at least sufficient to reach the layer 104, and preferably sufficient to reach the layer 103.

The device 100 is constituted by separate unit light-emitting elements 120a, 120b, 120c, and so on, formed by zoning the thin layers by the dividing grooves 110 in the conductive electrode layer 102 and the dividing grooves 115 in the functional layer 103 and the rear electrode layer 104.

As shown in FIG. 13, the layer 104 partly penetrates in the grooves 111 and contacts with the layer 102, so that one unit light-emitting element 120a, for example, is electrically connected to its adjacent unit light-emitting element 120b in series.

Specifically, the grooves 110 and the grooves 115 are located at different positions, and as a result the functional layer (laminated layer) 103a and the rear electrode layer (second electrode layer) 104a of the one element 120a hang out from the conductive electrode layer (first electrode layer) 102a, and overhang the adjacent unit light-emitting element 120b. A penetrating part 121a, which is the part of the layer 104a penetrating in the groove 111, contacts with the layer 102b of the adjacent element 120b.

The grooves 115 each are formed by a number of continuous small holes 28 formed by a laser scribing method using pulsed laser beam.

The small holes 28 each increase in diameter from a side of the glass substrate 101 adjacent to the layer 102 toward the layer 104.

The distance W between centers of adjacent small holes 28 is 10 to 80 micrometers and preferably 20 to 50 micrometers.

The layer 103 and the layer 104 are divided by the small holes 28, which overlap in those respective layers, and the layer 102 remains a conductive part 30 between the small holes 28, which do not overlap in that layer.

Figure 28:
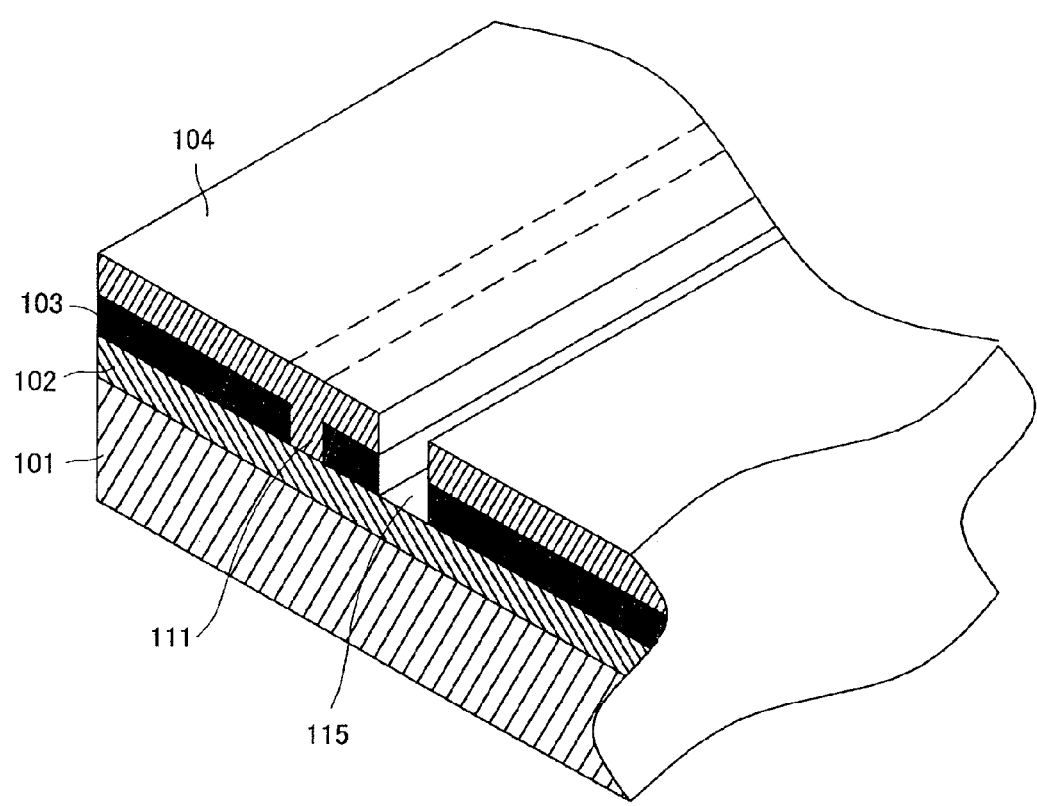
FIG. 28 is a sectional perspective view of an organic EL device of the present invention immediately after performing one step of the production process of the present invention, in which a unit light-emitting-element dividing groove is formed.
Figure 30:
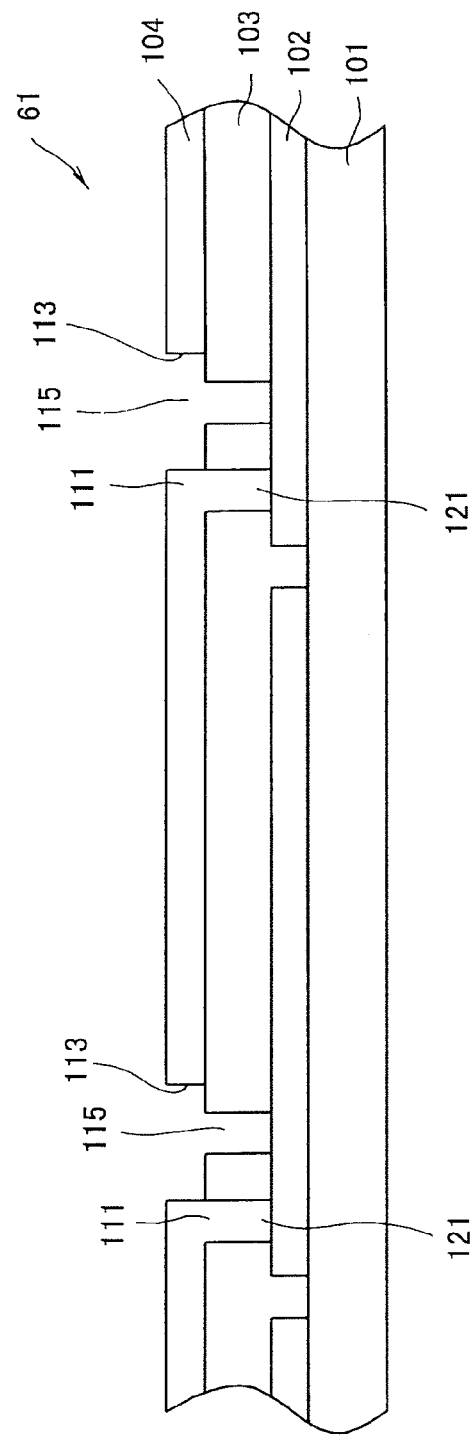
FIG. 30 is a cross section of an organic EL device of the present invention produced by performing the step shown in FIG. 29.
Figure 31C:
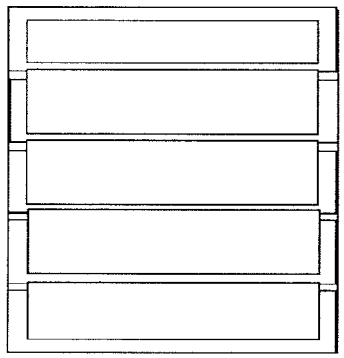
FIGS. 31A to 31F are views of FIGS. 1A to 1F shown more clearly without background color.
Figure 31F:
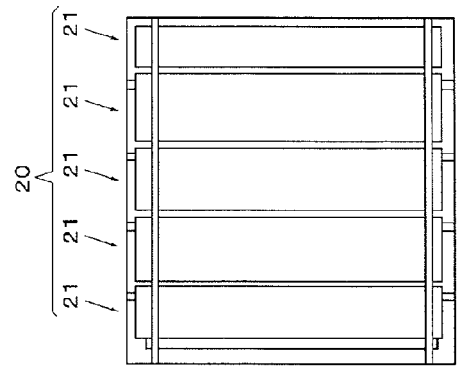
Figure 31B:
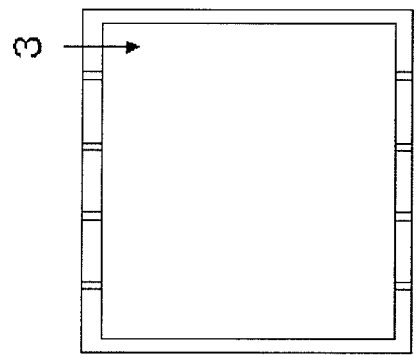
Figure 31E:
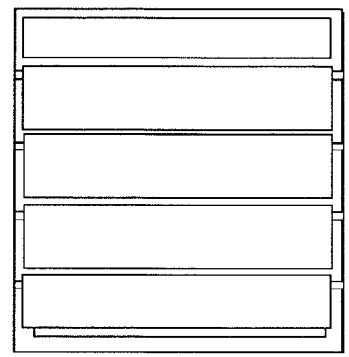
Figure 31A:
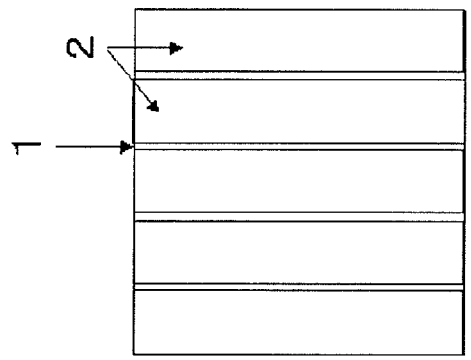
Figure 31D:
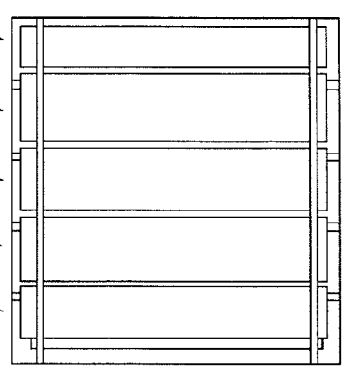
Figure 32:
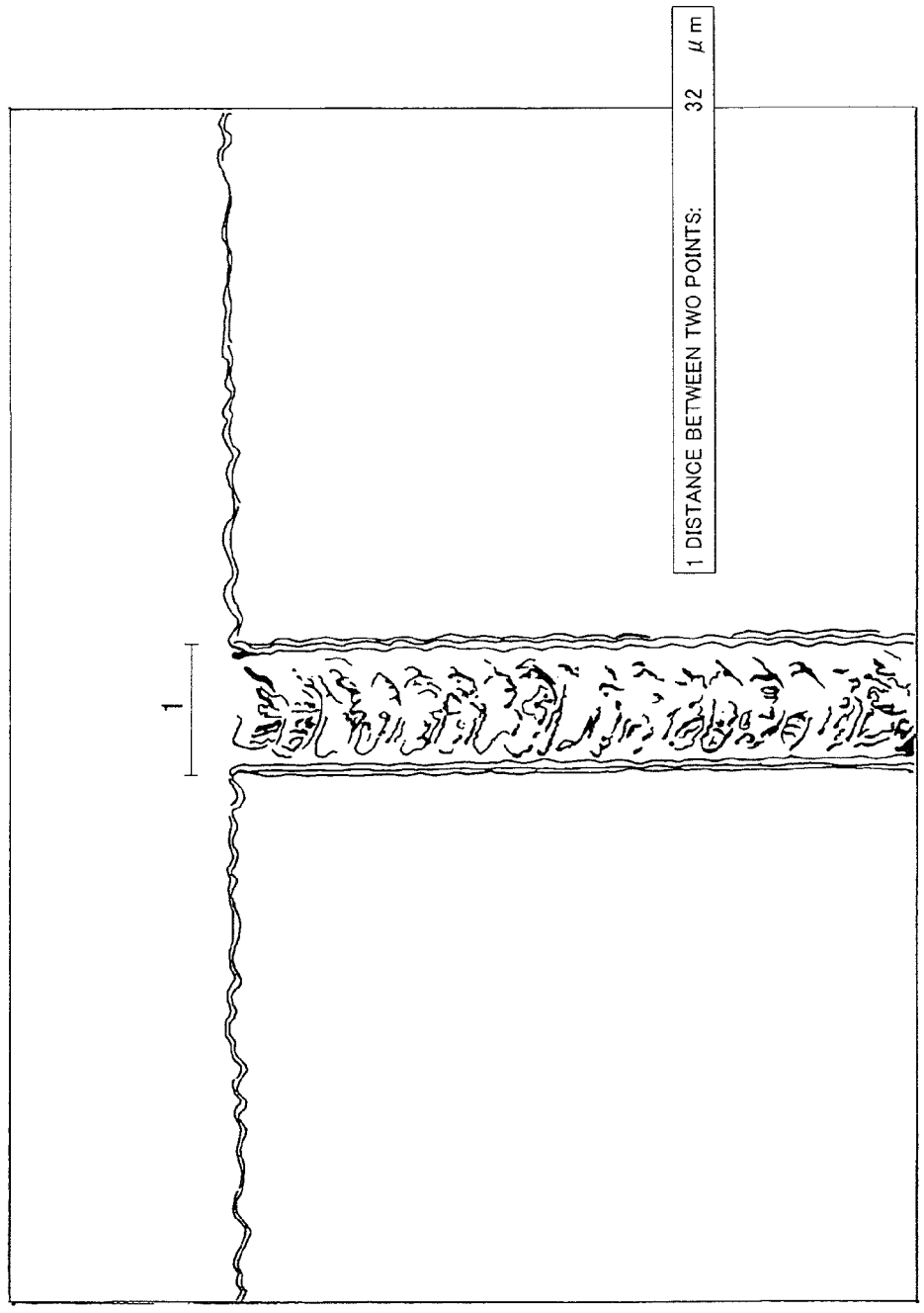
FIG. 32 is a drawing of the photo in FIG. 2.
Figure 33A:
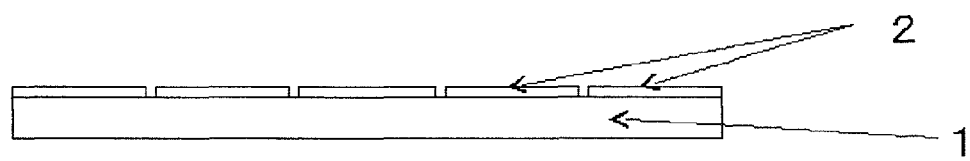
FIGS. 33A to 33E are views of FIGS. 3A to 3E shown more clearly without background color.
Figure 33B:
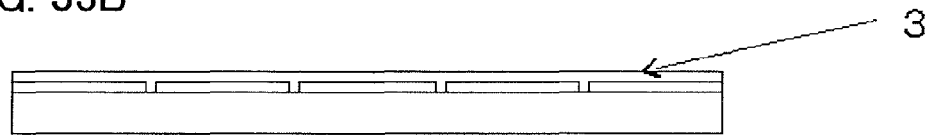
Figure 33C:
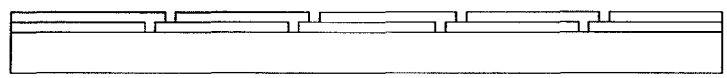
Figure 33D:
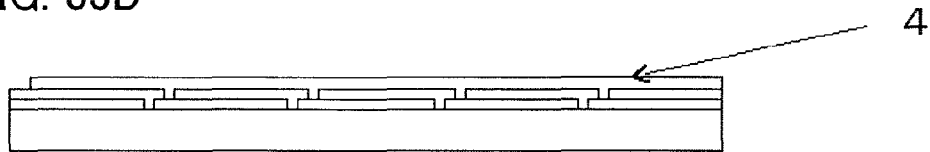
Figure 33E:
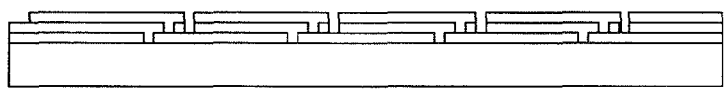
Figure 34:
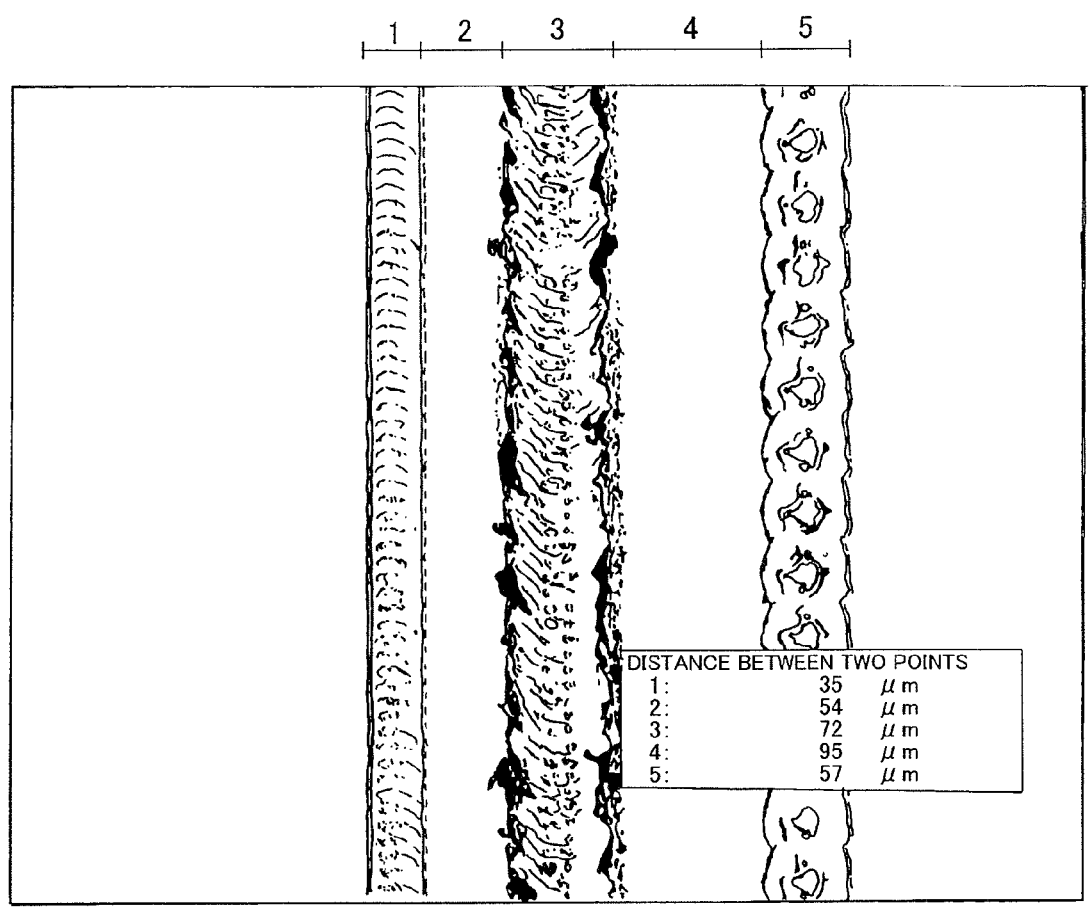
FIG. 34 is a drawing of the photo in FIG. 5.
Figure 35:
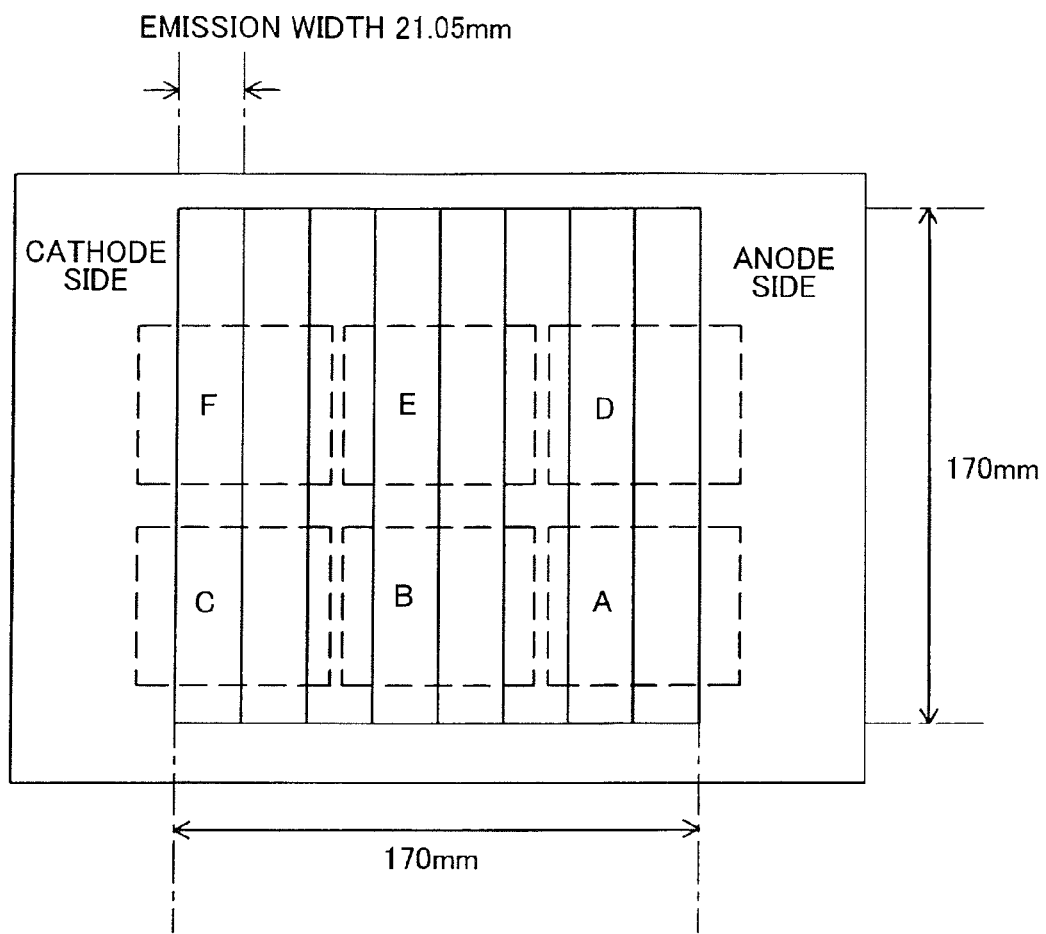
FIG. 35 is a drawing of the photo in FIG. 6.
Figure 36:
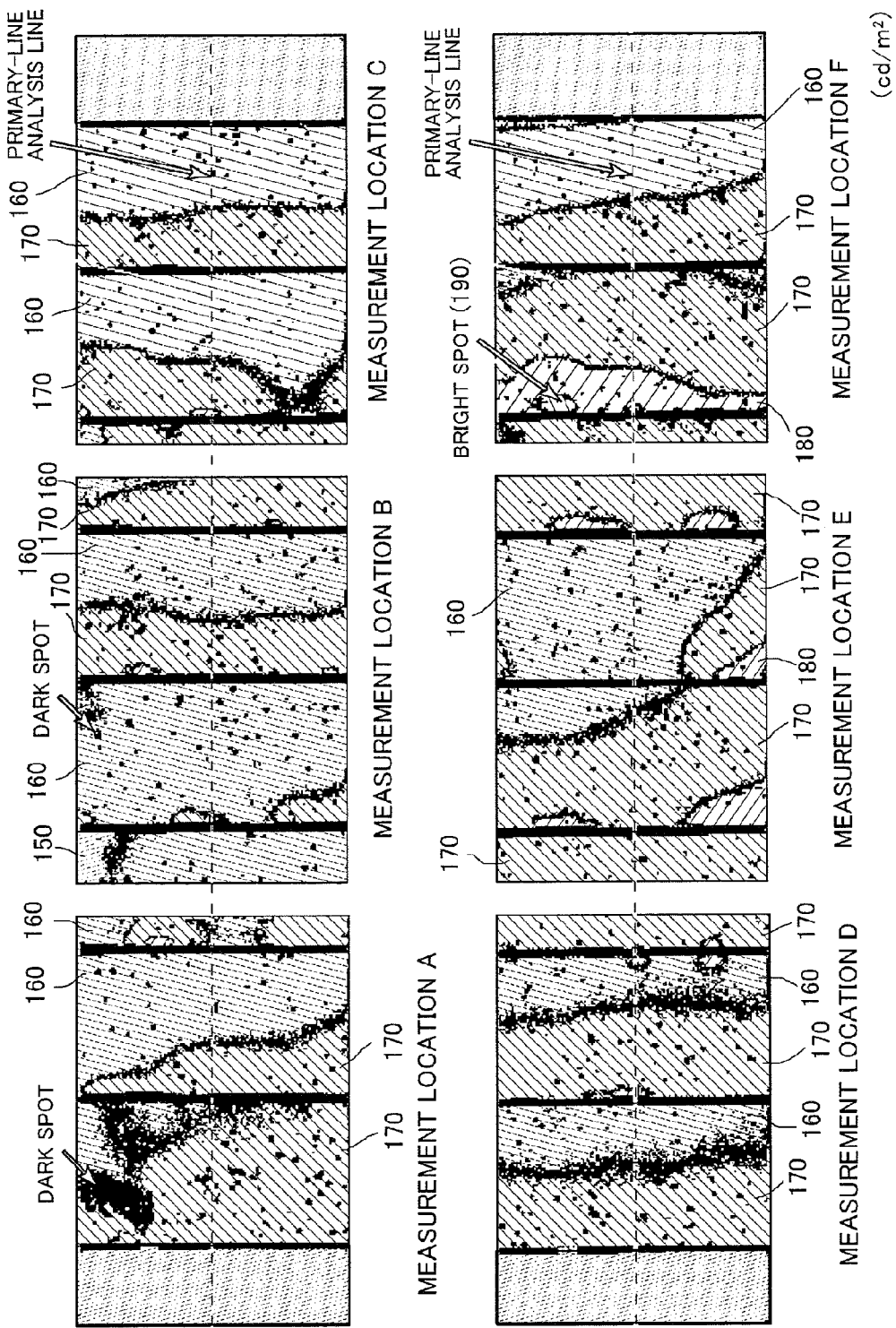
FIG. 36 illustrates FIG. 7 more clearly with hatching added, brightness values being approximate ones.
Figure 39A:
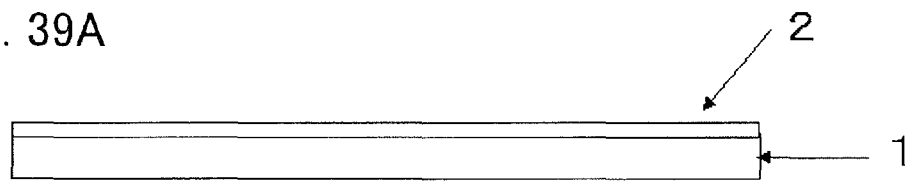
FIGS. 39A to 39C are views of FIGS. 11A to 11C shown more clearly without background color.
Figure 39B:
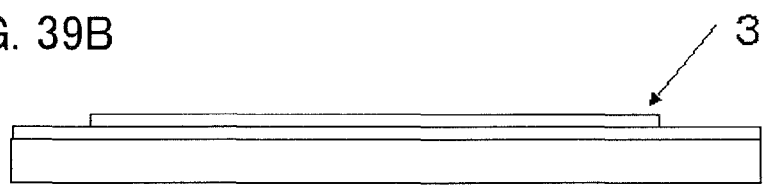
Figure 39C:
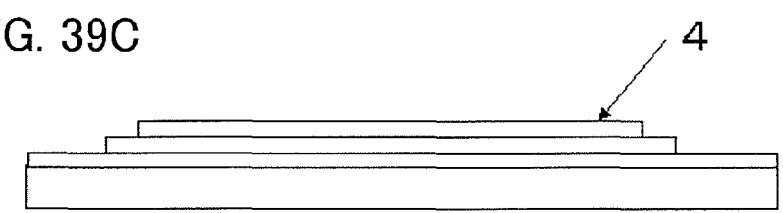
Figure 40:
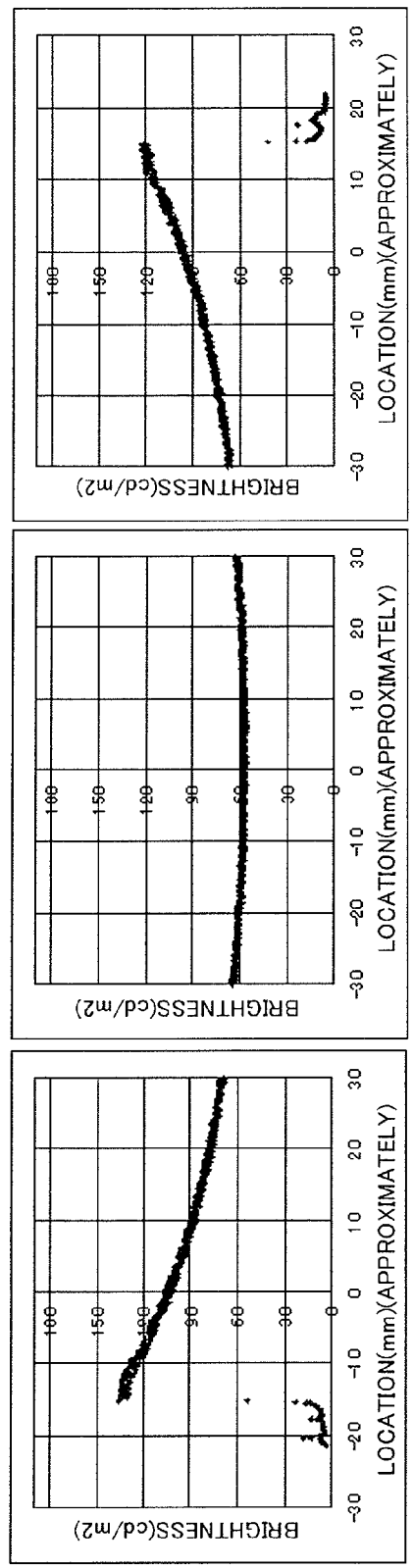
FIG. 40 illustrates FIG. 12 more clearly without background color.

An organic EL device 61 (see FIG. 30) produced by the production method described in FIGS. 27 to 29 has unit light-emitting-element dividing grooves 115 and emission-layer dividing grooves (vias) 111, which are located adjacently in a planar view of the device 61, with the grooves 115 each having an opening that increases in diameter. In sum, of the fourth grooves 113 and the third grooves 112 constituting the groove 115, the former is wider than the latter. More specifically, a part of the layer 104 adjacent to each of the holes 28 constituting the groove 115 and adjacent to the grooves 111 is removed as a ribbon, so that the groove 115 has a width wider at a portion adjacent to the grooves 111 than the other portion.

Hence, an edge in a width direction of the light-emitting-element dividing groove 115 reaches an extent where the layer 104 penetrates in the groove 111. In sum, the edge in the width direction of the groove 115 has contact with the penetrating part 121 of the layer 104.

Therefore, the widths of the grooves zoning the rear electrode layer 104 are wide, thereby protecting the zones of the rear electrode layer 104 from an electrical short.

EXAMPLES

Now, detailed methods for producing specific example embodiments of an organic EL device according to the present invention and comparative examples corresponding thereto and evaluation results thereof will be described below.

Example 1

The light-transmissive substrate employed an alkali-free glass having a thickness of 0.7 mm and coated with an indium-doped tin oxide (ITO) film of 150 nm average film thickness on the entire surface. The substrate (200 mm×200 mm) was placed on an XY stage with the ITO film facing upward. A laser beam was applied from above using a light source of a fundamental harmonic of a YAG laser, so as to remove a part of the ITO film as shown in FIG. 1A while minimizing the possibility of damaging the glass. This step formed the first-electrode-layer dividing grooves 110 on the conductive electrode layer 102 by executing the first laser scribing step. The laser beam had an oscillation frequency of 15 kHz, an output power of 14 W, a beam diameter of about 25 μm, and a processing speed of 50 mm/second. FIG. 2 shows an enlarged planar photo of a laser-processed portion of the glass substrate with the patterned ITO film.

The resulting substrate was washed with a neutral detergent and heated at 150 degrees centigrade for 20 minutes so as to be dried. It was confirmed that resistance values between adjacent strip-like ITO portions each were mostly 20 MΩ2 or more. Thereafter, the laminated layer, consisting primarily of low molecular weight organic compounds, was formed on the patterned anode electrode using a vacuum evaporator. Specifically, molybdenum oxide and 4, 4'-bis[N-(2-naphthyl)-N- phenyl-amino]biphenyl (hereafter abbreviated to α-NPD), expressed in the chemical formula specified below, were laminated by a vacuum co-evaporation method at evaporation speeds of 0.015 nm/second and 0.135 nm/second respectively so as to have a film thickness of 10 nm, thereby forming a hole injection layer constituting a light-emitting unit in the first layer just above the ITO film.

[Chemical Formula 1]

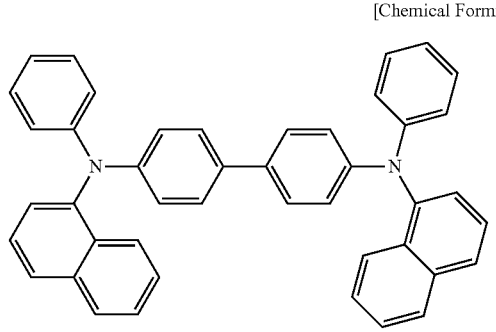

Then, α-NPD was laminated by a vacuum evaporation method at an evaporation speed of 0.08 to 0.12 nm/second so as to have a film thickness of 50 nm, thereby forming a hole transport layer.

Then, [tris(8-hydroxyquinolinato)]aluminum(III) (hereafter abbreviated to $Alq_3$) expressed in the chemical formula specified below was laminated by a vacuum evaporation method at an evaporation speed of 0.25 to 0.30 nm/second so as to have a film thickness of 70 nm, thereby forming an emission layer and functioning also as an electron transport layer.

[Chemical Formula 2]

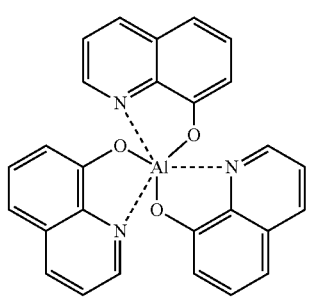

Then, LiF was laminated on a cathode by a vacuum evaporation method at an evaporation speed of 0.01 to 0.05 nm/second so as to have a film thickness of 1 nm. Further, an Al cathode electrode was laminated on the LiF by a vacuum evaporation method at an evaporation speed of 0.30 to 0.35 nm/second so as to have a film thickness of 150 nm. The resulting film formed by the vacuum evaporation methods is shown in a view in FIG. 1B.

Thereafter, the glass substrate on which the laminated layer containing the organic-compound layers was laminated was placed on the XY stage with the laminated layer facing downward. The glass substrate was secured at four corners thereof while being kept 7 mm away from, and in parallel with, the XY stage so as to avoid direct contact of the laminated layer with the XY stage. In this state, a laser beam was applied from above using a light source of a second high harmonic of the YAG laser, thereby partly removing the laminated layer in rows parallel with the removed grooves of the ITO layer, while minimizing the possibility of damaging the glass substrate and the ITO layer. This step formed the emission-layer dividing grooves 111 by executing the second laser scribing step.

The laser beam had an oscillation frequency of 5 kHz, an output power of 0.4 W, a beam diameter of about 25 μm, and a processing speed of 50 mm/second. The distance between the resulting groove 111 and the removed groove 110 of the ITO layer was 100 μm. FIG. 1C shows the state after the laser processing.

After partly removing the laminated layer, the glass substrate was placed again in the vacuum evaporator and Al was further laminated on the outermost surface Al layer by a vacuum evaporation method at an evaporation speed of 0.30 to 0.35 nm/second so as to have a film thickness of 150 nm. FIG. 1D shows the state with the Al layer formed.

The resulting glass substrate was placed on the XY stage with the Al layer facing downward. As well as the former case of removal of the laminated layer, the glass substrate was secured at the four corners thereof while being kept 7 mm away from, and in parallel with, the XY stage, so as to avoid direct contact of the layer with the XY stage. In this state, the laser beam was applied from above using a light source of the second high harmonic of the YAG laser, thereby partly removing the Al layer in rows in parallel with the removed grooves of the laminated layer while minimizing the possibility of damaging the glass substrate and the ITO layer. This step formed the unit light-emitting-element dividing grooves 115 by executing the third laser scribing step.

The laser beam had an oscillation frequency of 5 kHz, an output power of 0.4 W, a beam diameter of about 25 μm, and a processing speed of 200 mm/second. The distance between the resulting groove 115 and the removed groove 111 of the laminated layer was 100 μm. FIG. 1E shows the state after the laser processing. This series of processes of producing the integrated organic EL light-emitting device are shown in cross sections in FIGS. 3A to 3E.

Figure 3A:
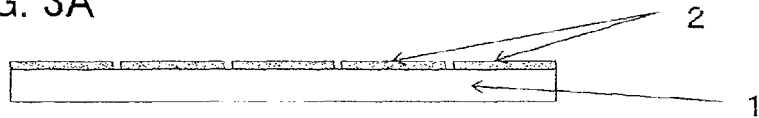
FIGS. 3A to 3E are cross sections illustrating the production process of the organic EL device of Example 1.
Figure 3B:
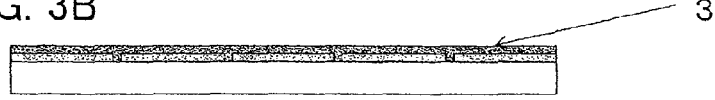
Figure 3C:
Figure 3D:
Figure 3E:
Figure 4:
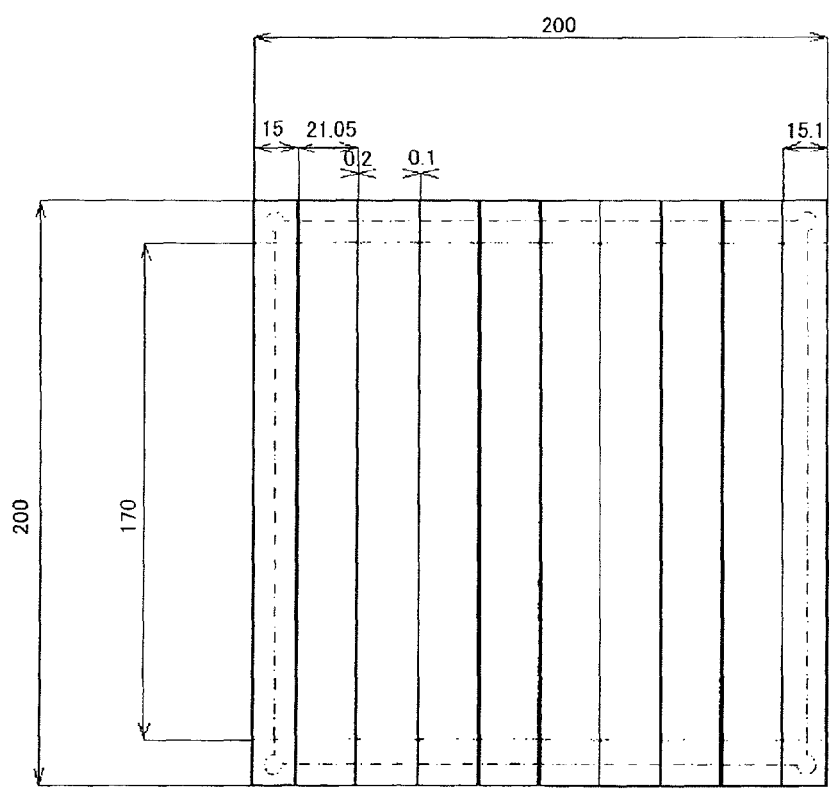
FIG. 4 is a plan view illustrating a patterning of a light-transmissive first conductive electrode layer, an organic-compound laminated layer, and a second electrode layer embodied in Example 1.
Figure 5:
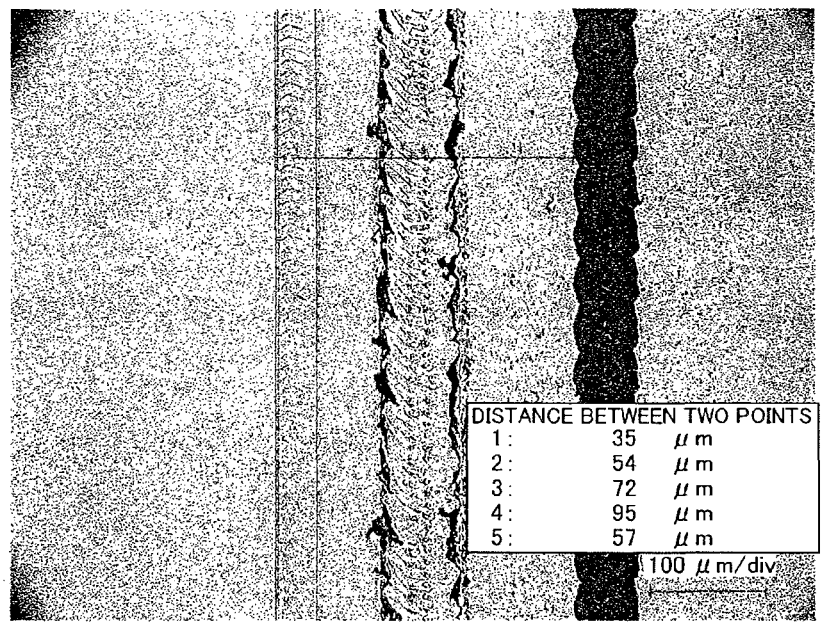
FIG. 5 is a planar photo of an integrated part of an organic EL device produced according to the production process of Example 1.

Further, for insulation from an outer peripheral part, as shown in FIG. 1F, the second high harmonic of the YAG laser was applied in a direction perpendicular to the removed lines of the layers, so as to partly remove the ITO layer, the laminated layer, and the second electrode layer, and as a result the organic EL device was completed. The laser beam had an oscillation frequency of 5 kHz, an output power of 0.4 W, a beam diameter of about 25 μm, and a processing speed of 50 mm/second. As a consequence, as shown in FIG. 4, the light-emitting section 20 (170 mm×170 mm) was electrically divided into eight strip-like light-emitting sections 21, which were connected in series. An enlarged planar photo of the connected portion is shown in FIG. 5.

Figure 6:
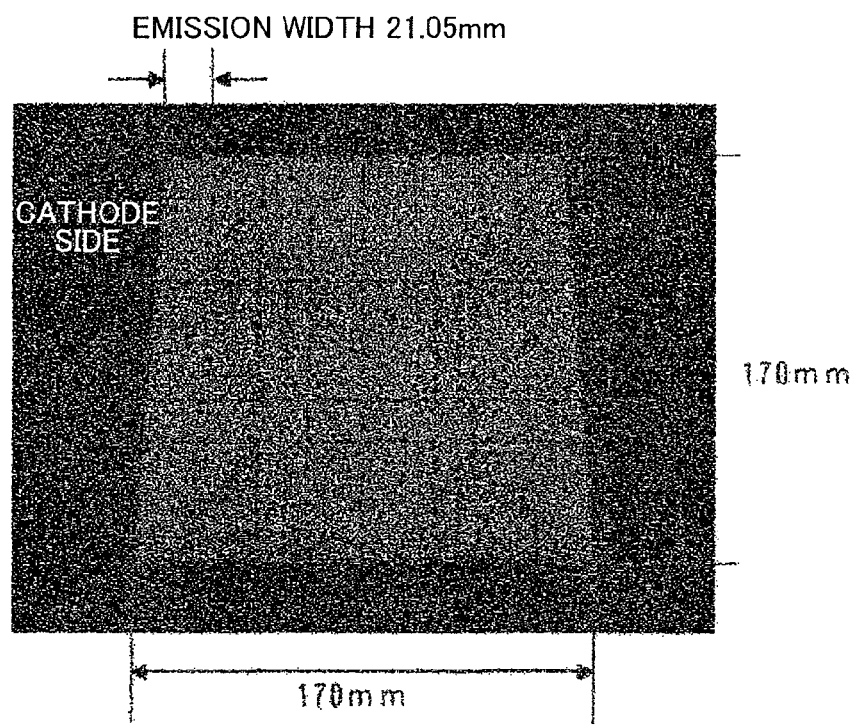
FIG. 6 is a photo in light emission of an integrated organic EL device produced in Example 1.
Figure 7:
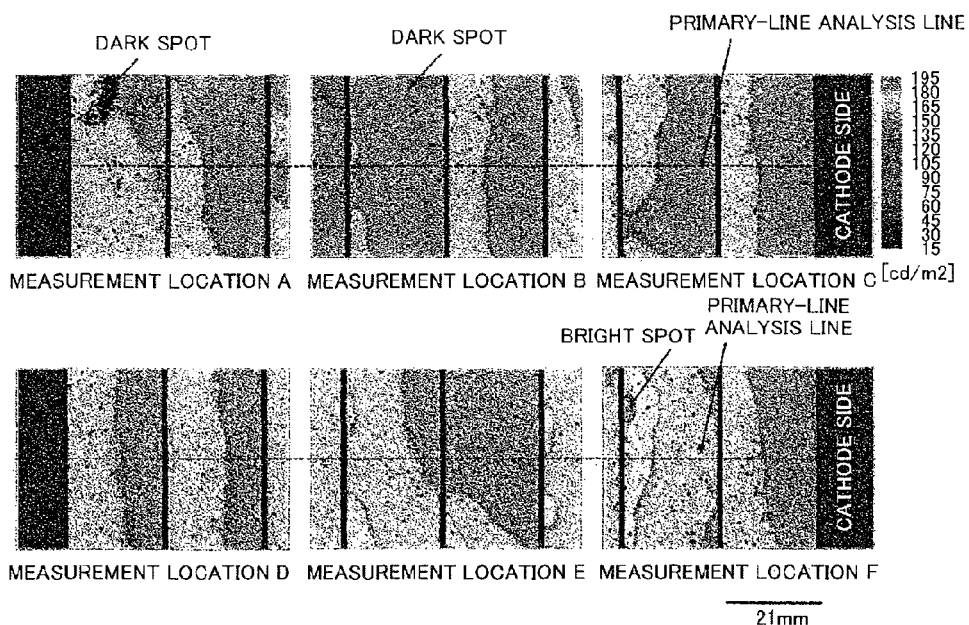
FIG. 7 illustrates brightness planar distributions of the integrated organic EL device shown in FIG. 6.
Figure 8:
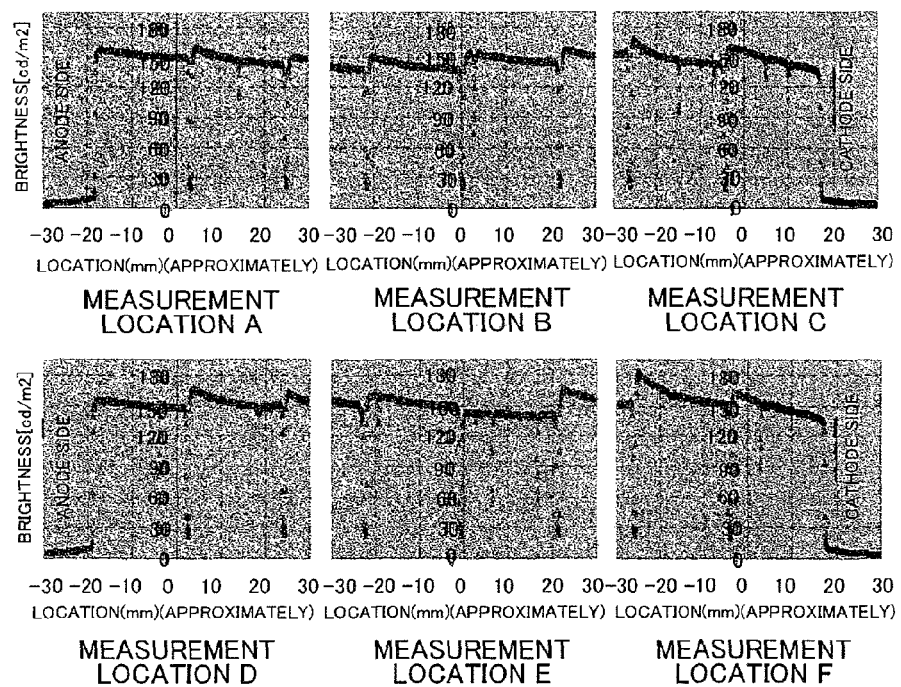
FIG. 8 illustrates brightness distributions on primary-line analysis lines in FIG. 7.

At the end, the performances of the integrated organic EL devices produced in the above-mentioned methods were measured in the following procedures. As shown in FIG. 6, six pieces (A to F) of 50 mm×50 mm, each containing the light-emitting section of the device, were detected and subjected to a brightness distribution measurement with a brightness distribution meter when 40V was applied to the entire device, corresponding to 5 V applied to each piece containing the light-emitting sections. The results (brightness distributions) of those pieces are shown in FIG. 7. The brightness distributions at primary-line analysis lines shown in FIG. 7, are shown in FIG. 8. Average brightnesses of the pieces are shown in Table 1 (average brightness at each position in FIG. 6 of the device produced in each example).

TABLE 1

| MEASUREMENT LOCATION | A | B | C | D | E | F |
|---|---|---|---|---|---|---|
| EXAMPLE 1 | 146.39 | 140.64 | 144.48 | 148.52 | 144.28 | 150.37 |
| EXAMPLE 2 | 145.53 | 144.81 | 142.64 | 146.66 | 143.12 | 149.88 |
| EXAMPLE 3 | 147.35 | 151.23 | 148.77 | 148.93 | 153.26 | 154.17 |
| EXAMPLE 4 | 146.65 | 144.76 | 143.33 | 146.79 | 145.55 | 162.51 |

($cd/m^2$)

As is obvious from FIG. 8, a quite excellent brightness distribution is shown, with weak brightness distribution values found only in portions sandwiched between integrated parts. This is due to resistive loss in the light-transmissive electrode layer within the divided strip-like light-emitting sections, which is small relative to that found in an unintegrated device. It is possible to further improve the device by increasing the number of divisions so as to shorten the distances between the integrated parts. Patterning can be carried out by balancing the increase in man-hours with integration and loss of an effective area.

As seen above, according to this invention, even in an organic EL device for a large-area illumination of 200 mm×200 mm, a device emitting light almost evenly can be formed by simple processes by minimizing the resistance value of the light-transmissive conductive layer.

Example 2

The substrate employed an alkali-free glass (200 mm×200 mm) having a thickness of 0.7 mm and coated with an ITO film of 150 nm average film thickness. The ITO film had undergone chemical etching into a form shown in FIG. 1A, and had an average etching width of 50 µm. The resulting substrate was washed with a neutral detergent and heated at 150 degrees centigrade for 20 minutes so as to be dried. It was confirmed that resistance values between strip-like ITO portions each were in general 20 MΩ or more. Thereafter, the resulting substrate was placed in a vacuum evaporator, as a result an organic EL device was produced in the same method as in Example 1. The performance of the integrated organic EL device produced in this method was measured in the same manner as Example 1. Average brightnesses of the same portions as those of Example 1 are shown in Table 1.

This Example executed a chemical etching on the light-transmissive conductive layer for the patterning in Example 1. Despite an increased cost for processing and a reduced light-emitting area due to an increased removal area of the conductive layer, there can be provided an organic EL device for large-area illumination emitting light evenly with narrow brightness distribution as in Example 1.

Example 3

An integrated organic EL device was produced by the same method as in Example 1. Two adjacent strip-like pieces were chosen from the second electrode layer of the device so as to be subjected to the following procedure. A voltage of 0.1 V was applied in between the pieces in a direction opposite to the elements and resistances therebetween were measured. The results are shown by white circles (o) on the far left in FIG. 9. Thereafter, the applied voltage was increased repeatedly by 0.1 V and the resistances were measured each time until the voltage reached 5 V. The results are shown by white circles (o) other than those on the far left in FIG. 9. Then, after the applied voltage was decreased to 0 V, the voltages were increased repeatedly by 0.1 V and the resistances were measured until reaching 5 V. The results are shown by black circles (●) in FIG. 9. The results support that application of a voltage above a certain level eliminates micro defects and reduces leakage current. This procedure was executed in between every adjacent piece of the second electrode layer. Thereafter, the brightness was measured in the same manner as Example 1. Average brightnesses of the same portions as those of Example 1 are shown in Table 1.

This example included a means in addition to the means of Example 1 so as to remove a portion of the organic EL device where a slight leakage current remained. It provides an excellent brightness distribution equal to or surpassing that in Example 1, and a higher average brightness obtained for the same level of applied voltage, as a result of the reduction of the leakage current, which resulted in current efficiency and output efficiency being improved.

Example 4

An integrated organic EL device was produced by the same method as in Example 1. Thereafter, dry nitrogen with the pressure reduced by a pressure reducing valve, was blown to integrated portions of this device from a cylinder, so as to remove powdery materials around the integrated portions. Then, the brightness was measured in the same manner as in Example 1. Average brightnesses of the same portions as those of Example 1 are shown in Table 1.

This example included a means in addition to the means of Example 1 so as to remove a portion of the organic EL device where a leakage current slightly remained, as in Example 3. It also provides an excellent brightness distribution equal to or surpassing that in Example 1 and a higher average brightness obtained for the same level of applied voltage, as a result of the reduction of the leakage current, which resulted in current efficiency and output efficiency being improved.

Comparative Example 1

The substrate employed the same alkali-free glass as one used in Example 1, having a thickness of 0.7 mm and coated with an ITO film of 150 nm average film thickness on the entire surface. The ITO layer of the substrate (200 mm×200 mm) was partly removed by chemical etching into a form shown in FIG. 10A. The resulting substrate was washed with a neutral detergent and heated at 150 degrees centigrade for 20 minutes so as to be dried.

Thereafter, the laminated layer consisting primarily of low molecular weight organic compounds was formed on the patterned anode electrode using a vacuum evaporator as in Example 1. At this time, evaporation was performed using a stainless steel mask so that the laminated layer had a planar shape as shown in FIG. 10B.

Figure 11A:
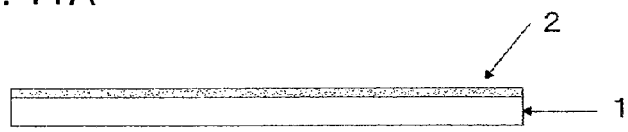
FIGS. 11A to 11C are cross sections each illustrating a patterning of an organic EL device embodied in a Comparative Example.
Figure 11B:
Figure 11C:
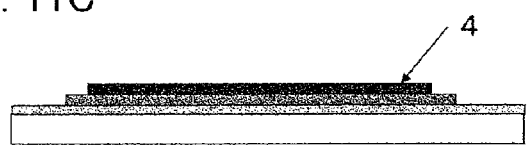

Then, LiF was laminated as a part of a cathode by a vacuum evaporation method using a stainless steel mask as shown in FIG. 10C so as to have a film thickness of 1 nm. Further, an Al cathode electrode was laminated onto the LiF by a vacuum evaporation method using a similar mask as above at an evaporation speed of 0.30 to 0.35 nm/second so as to have a film thickness of 150 nm. Cross sections of the organic EL light-emitting device produced by these processes are shown in FIGS. 11A to 11C.

Figure 12:
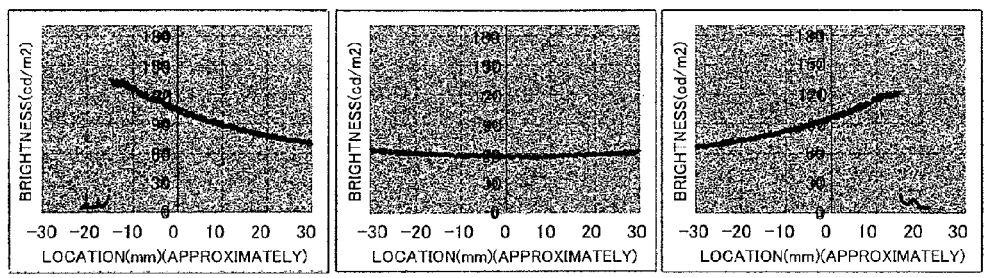
FIG. 12 illustrates brightness distributions in an ITO electrode direction of an organic EL device embodied in a Comparative Example.

The resulting organic EL device had a light-emitting area of 170 mm×170 mm and was unintegrated. The organic EL device was subjected to a voltage application of 5 V in between both electrodes so as to emit light. The brightness distribution was measured in the same manner as in the above Examples, and the distributions in an ITO electrode direction are shown in FIG. 12. As shown in FIG. 12, each end portion, where the resistive loss of the ITO was small, had a high brightness, while a center portion, where the resistive loss was high, had a low brightness. It revealed that the device herein had a higher brightness distribution than the devices in the above Examples.

Example 5

An integrated organic EL device was produced by a method substantially similar to that of Example 1 and differing only in the third laser scribing step. Specifically, in Example 1, the third laser scribing step was executed by applying the laser beam from above using a light source of the second high harmonic of the YAG laser. Meanwhile, in this Example, as shown in FIG. 16, the a focal point 26 of the laser beam 25 was an outside of the glass substrate 101.

Then, the Al layer was partly removed in rows, with the glass substrate 101 partly ablated.

The performance of the integrated organic EL device produced in this way was evaluated by the same manner as that in Example 1. The brightness distribution was quite excellent.

Example 6

An integrated organic EL device was produced under the same conditions as those in Example 1, differing only in a distance between the first-electrode dividing groove 110 and the unit light-emitting-element dividing groove 115. Specifically, the grooves 110 and the grooves 115 each were formed by a laser scribing method. Then, the distances between the grooves 110 and 115 were changed.

After formation of the grooves 115, the rear electrode layer 104 was sucked with vacuum and the surrounding of the grooves 115 was cleaned. The results were as shown in Table 2.

In a case where the distance A between trajectories of the laser beams 25 in forming the grooves was 130 micrometers or less, portions of the layer adjacent to the grooves 115 were removed like a ribbon. In contrast, in a case where the distance A was more than 140 micrometers, the portions failed to be removed.

The integrated organic EL device in which the portions of the layer adjacent to the grooves 115 were removed like a ribbon showed a quite excellent brightness distribution.

DESCRIPTION OF REFERENCE NUMERALS 1. light-transmissive substrate
2. light-transmissive first conductive electrode layer
3. laminated layer containing organic-compound layers
4. second conductive electrode layer
28. small hole
30. conductive part
55. conductive part
60. organic EL device (organic light-emitting device)
100. integrated organic EL device (integrated organic light-emitting device)
101. glass substrate (light-transmissive substrate, light-transmissive insulated substrate)
102. conductive electrode layer, first electrode layer
103. functional layer, laminated layer
104. rear electrode layer, second electrode layer
110. first-electrode dividing groove
111. emission-layer dividing groove, via
115. unit light-emitting-element dividing groove
120. unit light-emitting element

The invention claimed is:

1. An integrated organic light-emitting device comprising a laminated body consisting of a light-transmissive first electrode layer, a laminated layer containing at least one organic EL emission layer composed of an organic compound, and a second electrode layer laminated on a light-transmissive insulated substrate, the device having at least one first-electrode-layer dividing groove formed in the first electrode layer, at least one via formed in the laminated layer, and at least one unit light-emitting-element dividing groove having a depth reaching the second electrode layer from the laminated layer, wherein the first electrode layer is divided into a plurality of zones by the first-electrode-layer dividing grooves, wherein the laminated layer and the second electrode layer are divided into a plurality of zones each composed of a combination of the both layers by the unit light-emitting-element dividing grooves, wherein the first-electrode-layer dividing grooves and the unit light-emitting-element dividing grooves are located at different positions so that at least the second electrode layer of one zone overhangs the first electrode layer of its adjacent zone, wherein the first electrode layer in one zone and the combination of the laminated layer and the second electrode layer laminated on the first electrode layer in the one zone constitutes a unit light-emitting element, in which a part of the second electrode layer penetrates in the via so as to be electrically conducted to the first electrode layer in its adjacent zone, so that adjacent elements are electrically connected in series, and wherein the unit light-emitting-element dividing groove is formed by a number of continuous small holes, each hole having a shape increasing in diameter from the substrate toward the second electrode layer, so that at

TABLE 2

| DISTANCE A (μm) | 50 | 60 | 70 | 80 | 90 | 100 | 120 | 130 | 140 | 150 | 160 | 170 | 180 | 190 | 200 |
|---|---|---|---|---|---|---|---|---|---|---|---|---|---|---|---|
| o: REMOVED x: UNREMOVED | o | o | o | o | o | o | o | o | x | x | x | x | x | x | x | least the second electrode layer is divided by the holes, which overlap, and the first electrode layer has a conductive part between the holes, which do not overlap.

2. The device according to claim 1,
wherein the small holes each start from either inside of the substrate or the first electrode layer with a shape increasing in diameter toward the second electrode layer and do not overlap in the substrate.

3. The device according to claim 1,
wherein the small holes have a distance of 10 to 80 micrometers between centers of adjacent holes.

4. The device according to claim 1,
wherein the unit light-emitting-element dividing groove is located close to the via in a planar view and increases in groove width in the vicinity of the second electrode layer toward the via.

5. The device according to claim 1,
the via being a groove,
a part of the second electrode layer penetrating into the via, and
wherein the unit light-emitting-element dividing groove has an edge in a width direction reaching to the part of the second electrode layer penetrating into the via.

6. The device according to claim 1,
wherein an edge in a width direction of the unit light-emitting-element dividing groove reaches to an extent of the second electrode layer penetrating in the via.

7. The device according to claim 1,
wherein the laminated layer has an outermost layer in contact with the second electrode layer, the outermost layer being made of metal.

8. A method for producing an organic light-emitting device having a plurality of light-emitting sections electrically connected in series on a light-transmissive substrate, the method comprising the steps of:
 (a) forming a first conductive electrode layer being patterned and light transmissive, on the substrate;
 (b) forming a laminated layer containing a plurality of organic-compound layers so that the layer covers at least a part of the first electrode layer;
 (c) exposing a part of the first electrode layer by removal of a part of the laminated layer;
 (d) forming at least one layer containing a second conductive electrode layer on the laminated layer and the exposed part of the first electrode layer; and
 (e) simultaneously removing a part of the laminated layer and a part of the second electrode layer by application of a laser beam from a side of the substrate.

9. The method according to claim 8,
wherein the step (a) includes a step of removing a part of the first electrode layer by application of a laser beam after forming the first electrode layer on the substrate.

10. The method according to claim 8,
wherein the laminated layer has an outermost layer farthest from the substrate, the outermost layer being a conductive thin-film layer.

11. The method according to claim 8,
wherein the step (c) includes a step of applying a laser beam onto the laminated layer.

12. The method according to claim 11,
wherein the step of applying the laser beam is done from the side of the substrate.

13. The method according to claim 8,
wherein the laser beam used in the step (e) has a light source of a high harmonic of a neodymium YAG laser.

14. The method according to claim 11,
wherein the laser beam used in the step (c) has a light source of a high harmonic of a neodymium YAG laser.

15. The method according to claim 9,
wherein the step (a) includes a step of removing a part of the first electrode layer by applying a laser beam using a fundamental harmonic of a neodymium YAG laser as a light source after forming the first electrode layer on the substrate.

16. The method according to claim 8,
further including a step of applying a voltage onto at least a part of each of the light-emitting sections on the substrate in a reverse direction after the step (e) so as to reduce a leakage current from the light-emitting sections.

17. The method according to claim 8,
including a step of bringing at least a part of the removed part into contact with a fluid after the step (e) so as to reduce a leakage current from the light-emitting sections.

18. The method according to claim 8,
wherein the laser beam used in the step (e) is applied in pulses entering from the substrate and has a focal point at a position located short of the laminated layer.

19. The method according to claim 8,
wherein the step (e) is performed by applying a pulsed laser beam from the side of the substrate by relatively moving an application point of the laser beam to draw a linear trajectory at a constant speed,
the laser beam having a pulse strength and the speed satisfying a relationship in which a number of small holes formed by pulses of the laser beam each have a shape increasing in diameter from the substrate toward the second electrode layer, so that the laminated layer and the second electrode layer are divided by the small holes, which overlap, and the first electrode layer has a conductive part between the holes, which do not overlap.

20. The method according to claim 8,
wherein the step (c) is performed by applying a laser beam onto the laminated layer by relatively moving an application point of the laser beam to draw a linear trajectory and the step (e) is also performed by forming grooves by relatively moving an application point of the laser beam to draw a linear trajectory, the linear trajectories having a distance of 130 micrometers or less between centers of the trajectories, and the method including a step of removing portions of the second electrode layer each located adjacent to each of the grooves after the step (e).

21. An organic light-emitting device produced by the method according to claim 8.

* * * * *